(12) United States Patent
Otani et al.

(10) Patent No.: US 11,049,738 B2
(45) Date of Patent: Jun. 29, 2021

(54) SUBSTRATE HEATING DEVICE

(71) Applicant: TOKYO ELECTRON LIMITED, Tokyo (JP)

(72) Inventors: Hibiki Otani, Koshi (JP); Yukinobu Otsuka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 76 days.

(21) Appl. No.: 15/955,208

(22) Filed: Apr. 17, 2018

(65) Prior Publication Data
US 2018/0308723 A1 Oct. 25, 2018

(30) Foreign Application Priority Data

Apr. 21, 2017 (JP) .............................. JP2017-084757

(51) Int. Cl.
*H01L 21/67* (2006.01)
*H01L 21/687* (2006.01)
*H01L 21/677* (2006.01)

(52) U.S. Cl.
CPC .... *H01L 21/67103* (2013.01); *H01L 21/6719* (2013.01); *H01L 21/67109* (2013.01); *H01L 21/67748* (2013.01); *H01L 21/68742* (2013.01); *H01L 21/68764* (2013.01); *H01L 21/68785* (2013.01)

(58) Field of Classification Search
None
See application file for complete search history.

(56) References Cited

U.S. PATENT DOCUMENTS

| 5,414,244 A | * | 5/1995 | Imahashi | ................ C30B 31/12 |
| | | | | 219/392 |
| 5,716,207 A | * | 2/1998 | Mishina | ............ H01L 21/67098 |
| | | | | 432/253 |
| 6,949,143 B1 | * | 9/2005 | Kurita | .................. B65G 49/068 |
| | | | | 118/719 |

(Continued)

FOREIGN PATENT DOCUMENTS

| JP | 2004-261801 A | 9/2004 |
| JP | 2007-294753 A | 11/2007 |

(Continued)

*Primary Examiner* — Sylvia MacArthur
(74) *Attorney, Agent, or Firm* — Nath, Goldberg & Meyer; Jerald L. Meyer; Tanya E. Harkins

(57) ABSTRACT

A substrate heating device includes: a heating plate for heating a first substrate mounted thereon; a cooling plate installed adjacent to the heating plate and for mounting a second substrate, before being heated, introduced to the cooling plate, and cool the first substrate; a substrate transfer mechanism for transferring the first or second substrate between the cooling plate and the heating plate; a heat shielding plate installed across a region below the heating plate and the cooling plate; a cooling mechanism for cooling the heat shielding plate; and a low oxygen atmosphere forming part for setting an atmosphere in which the first substrate is heated to a low oxygen atmosphere, wherein the substrate transfer mechanism includes a substrate holding part for holding the first or second substrate and a moving mechanism installed below the heat shielding plate to move the substrate holding part in the front-back direction.

12 Claims, 21 Drawing Sheets

(56) References Cited

U.S. PATENT DOCUMENTS

| | | | | |
|---|---|---|---|---|
| 7,641,434 | B2* | 1/2010 | Kurita | B65G 49/068 |
| | | | | 118/719 |
| 7,797,855 | B2* | 9/2010 | Fukuoka | C30B 33/02 |
| | | | | 118/709 |
| 8,138,456 | B2* | 3/2012 | Fukuda | H01L 21/67005 |
| | | | | 118/725 |
| 8,217,313 | B2* | 7/2012 | Fukuoka | F27B 17/0025 |
| | | | | 118/50.1 |
| 8,222,569 | B2* | 7/2012 | Sakai | H01L 21/67098 |
| | | | | 118/724 |
| 8,741,065 | B2* | 6/2014 | Odagiri | C23C 16/4586 |
| | | | | 118/715 |
| 8,814,563 | B2* | 8/2014 | Hayashi | F27B 5/04 |
| | | | | 427/374.1 |
| 8,864,933 | B2* | 10/2014 | Terada | H01L 21/31055 |
| | | | | 156/345.27 |
| 9,299,599 | B2* | 3/2016 | Douki | H01L 21/6715 |
| 2002/0005168 | A1* | 1/2002 | Kraus | H01L 21/67196 |
| | | | | 118/715 |
| 2007/0218706 | A1* | 9/2007 | Matsuoka | F27B 5/04 |
| | | | | 438/781 |
| 2015/0013606 | A1* | 1/2015 | Terada | H01L 21/67092 |
| | | | | 118/719 |
| 2015/0267300 | A1* | 9/2015 | Ranish | C23C 16/483 |
| | | | | 118/724 |
| 2018/0308723 | A1* | 10/2018 | Otani | H01L 21/67109 |

FOREIGN PATENT DOCUMENTS

| | | | |
|---|---|---|---|
| JP | 2008-303104 A | 12/2008 | |
| JP | 2012-79940 A | 4/2012 | |
| JP | 5220505 B2 | 3/2013 | |

\* cited by examiner

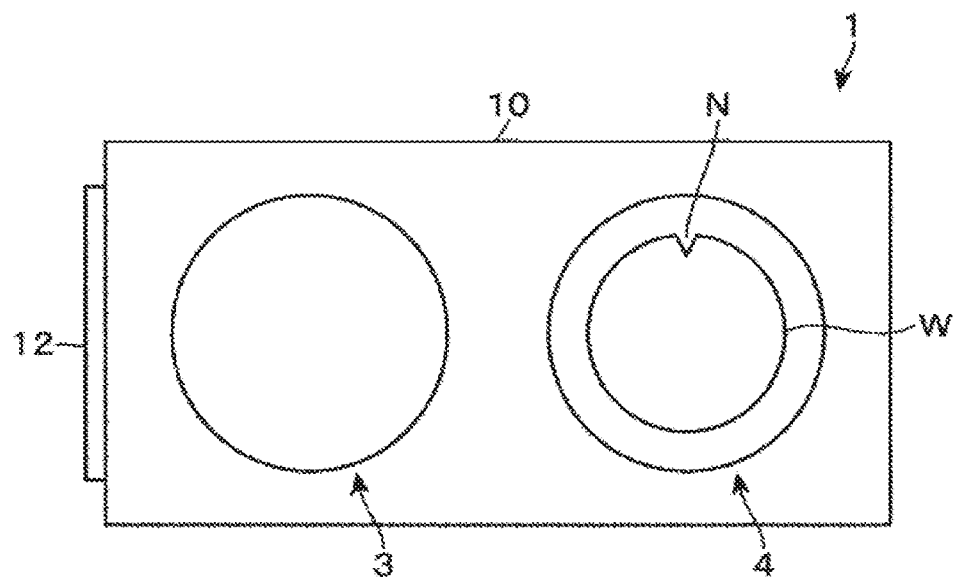
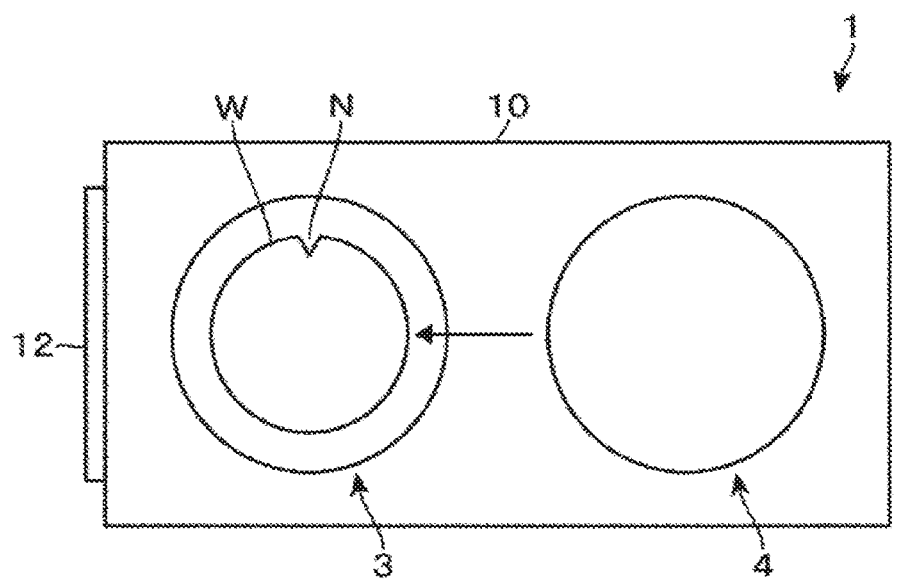

FIG. 33
Example 1
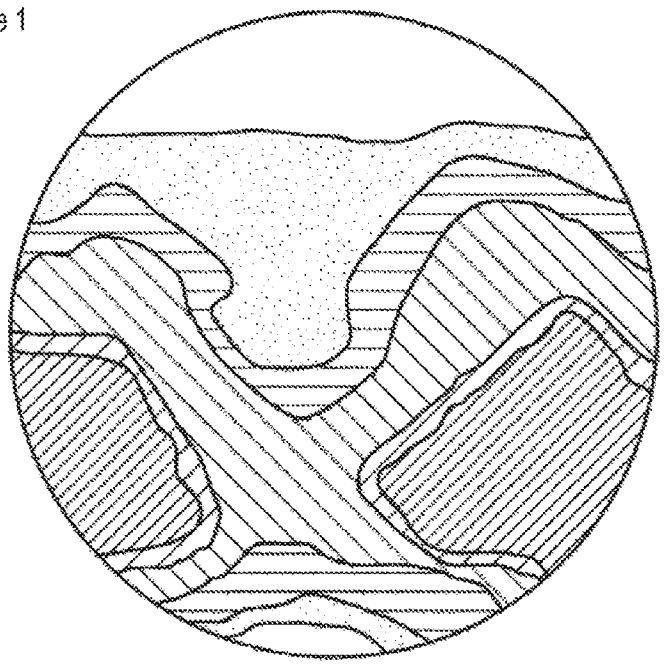
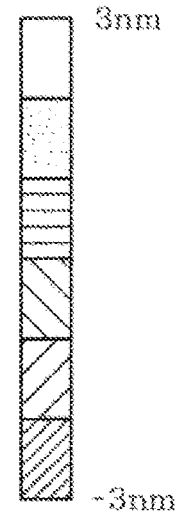
Example 2
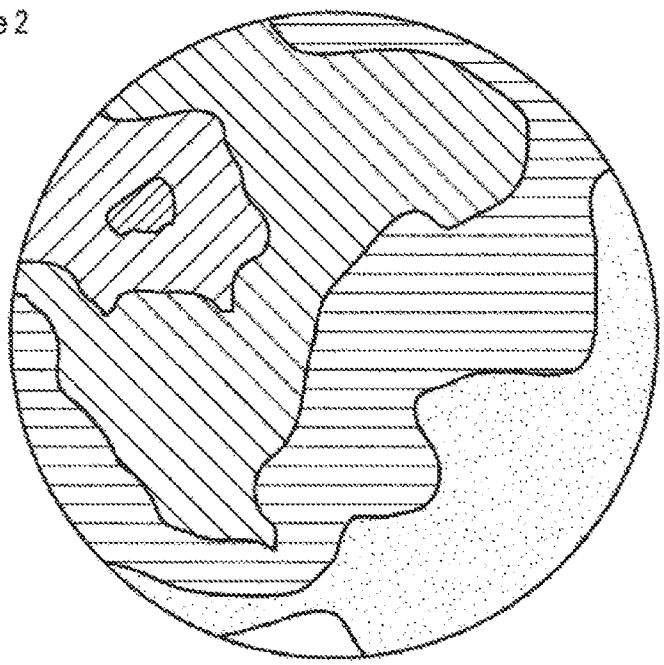

SUBSTRATE HEATING DEVICE

CROSS-REFERENCE TO RELATED APPLICATION

This application is based upon and claims the benefit of priority from Japanese Patent Application No. 2017-084757, filed on Apr. 21, 2017, the entire contents of which are incorporated herein by reference.

TECHNICAL FIELD

The present disclosure relates to a technique for performing a heat treatment with respect to a substrate mounted on a heating plate.

BACKGROUND

As a thin film serving as an etching mask used in a manufacturing process of a semiconductor manufacturing apparatus, for example, a coating film called a spin-on-carbon (SOC) film or the like is known. This coating film is obtained by spin-coating a chemical solution containing a precursor of the coating film on, for example, a semiconductor wafer (hereinafter, referred to as a "wafer"), followed by heating the wafer and curing the chemical solution by a crosslinking reaction. The etching resistance of the coating film is increased by increasing the denseness of the coating film. Thus, the etching resistance is increased as the heating temperature during the crosslinking reaction increases.

As semiconductor devices become thinner, an etching mask is required to have a higher etching resistance. As such, a temperature of a coating film is inevitably increased during heating. For example, a substrate heating device has been used in which a wafer is mounted on a heating plate for heating, the heated wafer is transferred onto a dedicated arm equipped with a cooling water pipe, and the heated wafer is moved to a transfer position at which an external transfer arm is disposed while the heated wafer is cooled down.

However, if the heating temperature of a heating part is increased, the cooling arm may be heated by the cooling arm when receiving the wafer mounted on the heating part by the cooling arm. Further, in a case where the cooling arm stops above the heating part, the cooling arm may be exposed to a high temperature for a long period of time. As a result, there is a concern that the cooling water for cooling the cooling arm will boil, or that the maintenance cycle may be shortened due to consumption by the heat load.

In addition, there has been proposed a configuration in which an arm for transferring a wafer W between a cooling plate and a heating part is installed. However, there is no description about measures against heat at a high temperature at which a heating temperature of the wafer by a heating plate exceeds 500 degrees C.

SUMMARY

The present disclosure provides some embodiments of a technique capable of suppressing an influence of heat radiated from a heating plate to a driving system installed in a substrate heating device for heating a substrate mounted on the heating plate.

According to one embodiment of the present disclosure, there is provided a substrate heating device, including: a heating plate configured to heat a first substrate mounted on the heating plate; a cooling plate installed adjacent to the heating plate in a front-back direction, and configured to mount a second substrate, before being heated, introduced to the cooling plate from outside, and cool the first substrate heated by the heating plate; a substrate transfer mechanism configured to transfer the first substrate or the second substrate between the cooling plate and the heating plate; a heat shielding plate installed across a region below the heating plate and the cooling plate; a cooling mechanism configured to cool the heat shielding plate; and a low oxygen atmosphere forming part configured to set an atmosphere in which the first substrate is heated to a low oxygen atmosphere, wherein the substrate transfer mechanism includes a substrate holding part configured to hold the first substrate or the second substrate and a moving mechanism installed below the heat shielding plate to move the substrate holding part in the front-back direction.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 26 is an explanatory view illustrating an operation of the heating device according to the second embodiment.

FIG. 27 is an explanatory view illustrating an operation of the heating device according to the second embodiment.

FIG. 33 is a contour map illustrating a film thickness distribution of a wafer in examples 1 and 2.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
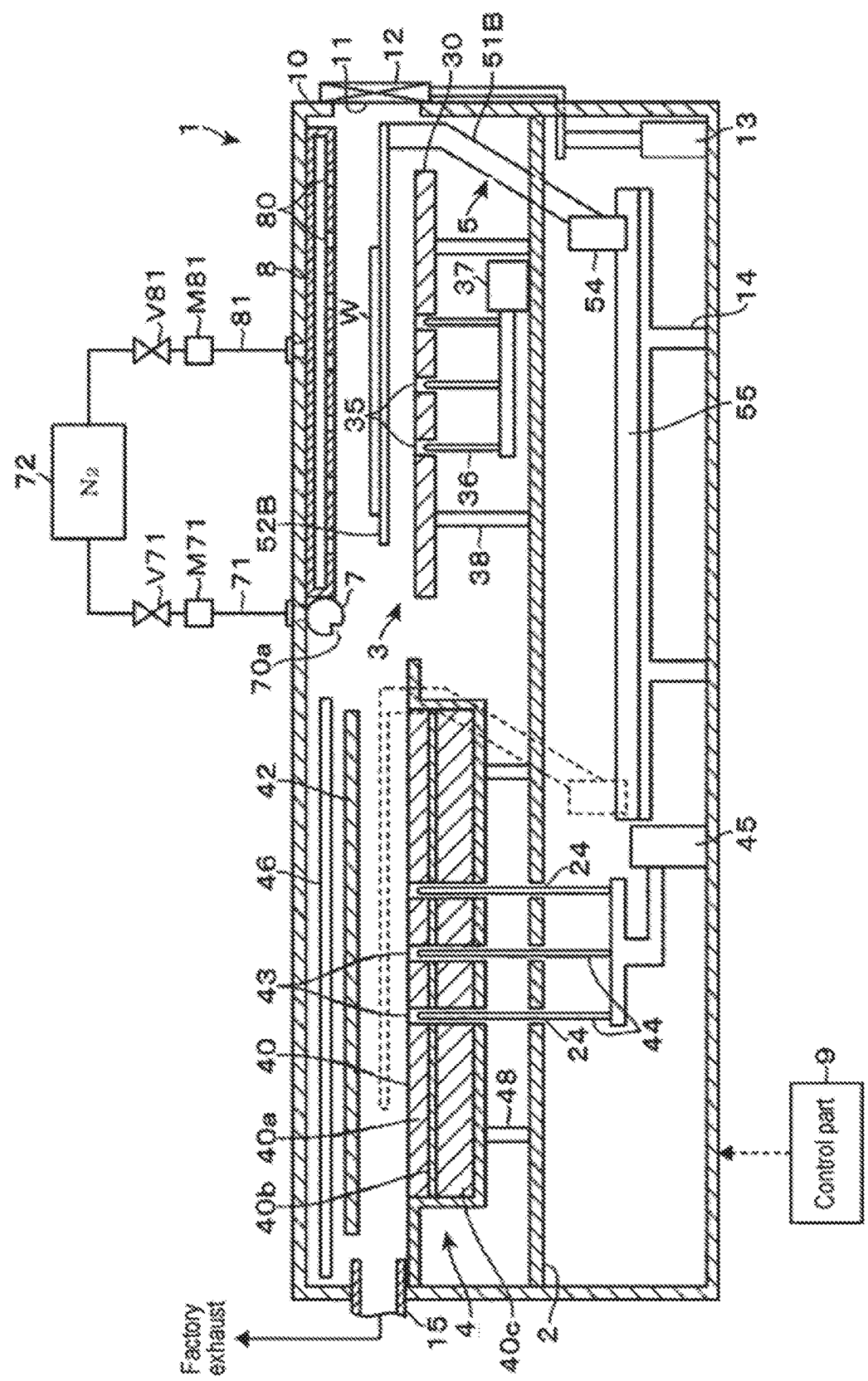
FIG. 1 is a longitudinal sectional view illustrating a heating device according to a first embodiment of the present disclosure.
Figure 2:
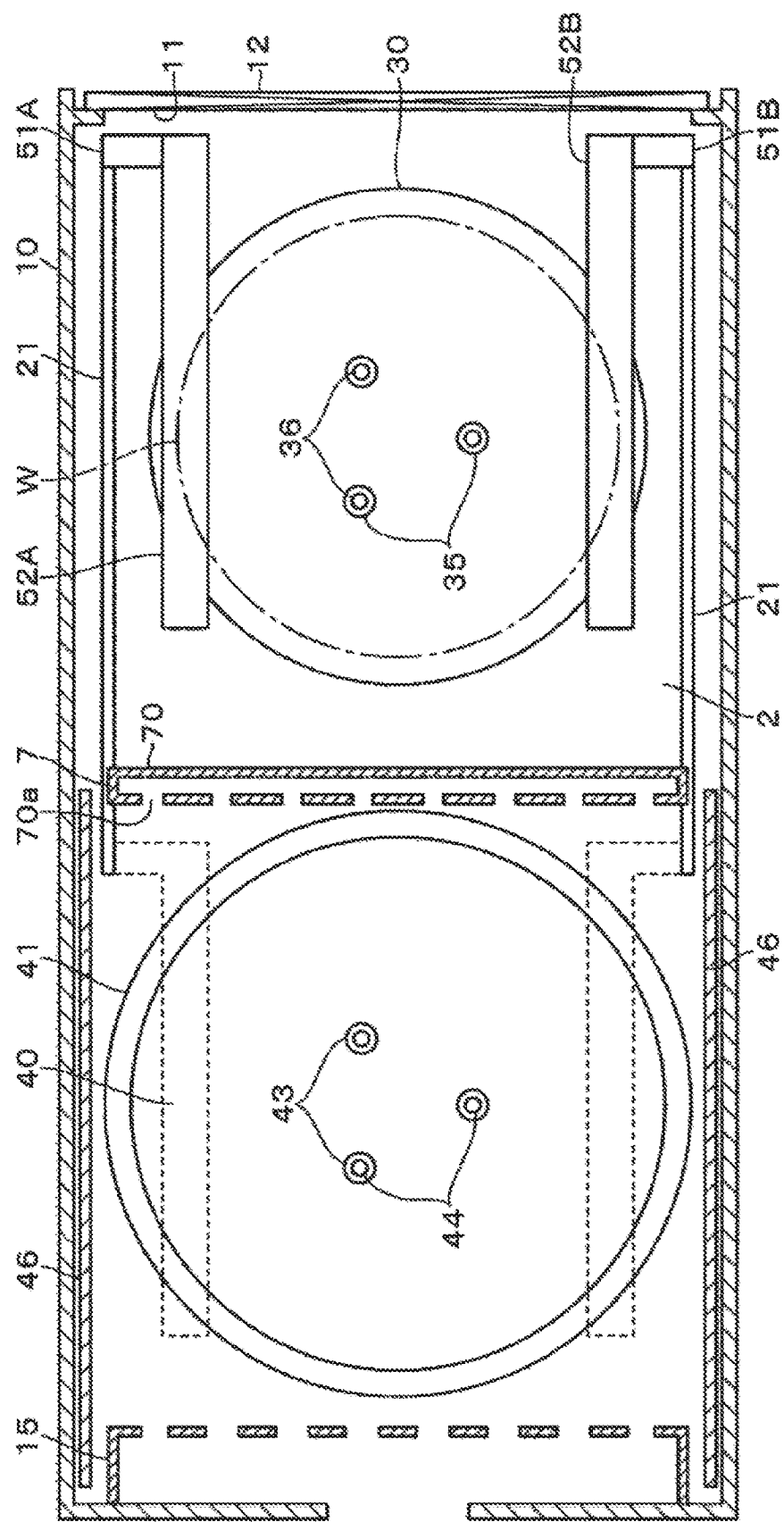
FIG. 2 is a plan view illustrating the heating device according to the first embodiment.

As illustrated in FIGS. 1 and 2, a heating device 1 as a substrate heating device according to an embodiment of the present disclosure includes a rectangular housing 10. The interior of the housing 10 is divided in an up-down direction by a water-cooling plate 2 which is a heat shielding plate. Assuming that a longitudinal direction of the housing 10 is a front-back direction, a loading/unloading port 11 through which a wafer W is loaded and unloaded is formed, for example, above the water-cooling plate 2 in an end surface of the front side of the housing 10 in the front-back direction. A shutter 12 for opening and closing the loading/unloading port 11 is installed in the loading/unloading port 11. The shutter 12 is configured to be opened and closed by a shutter opening/closing mechanism 13 installed inside the housing 10 and below the water-cooling plate 2.

Figure 3:
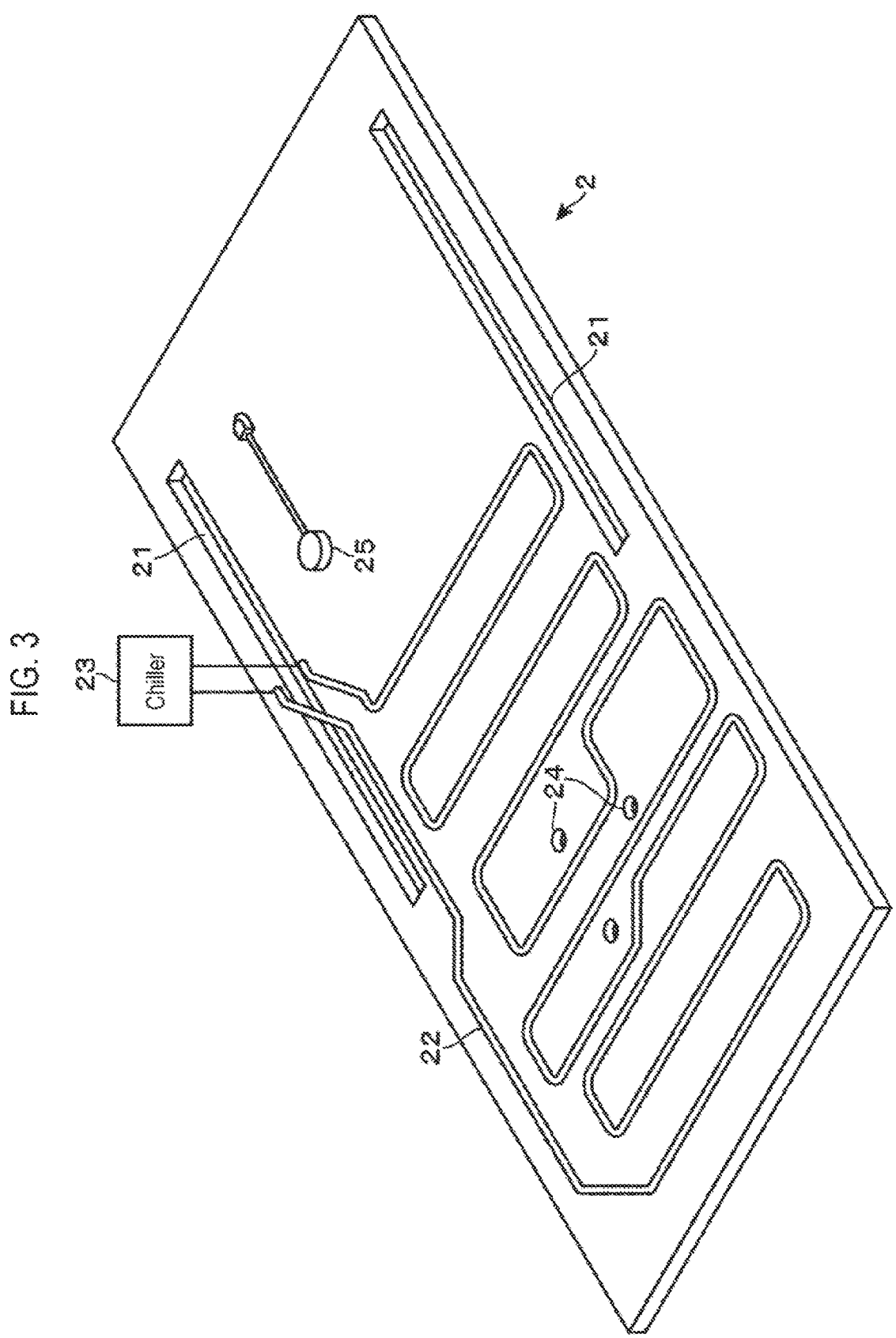
FIG. 3 is a perspective view illustrating a water-cooling plate.

As illustrated in FIG. 3, the water-cooling plate 2 is formed by a rectangular metal plate. For example, a cooling passage 22 through which cooling water flows is formed to be circulated inside the water-cooling plate 2. The cooling passage 22 is connected to a chiller 23 to allow, for example, the cooling water to flow through the cooling passage 22. Notches 21 are respectively formed at positions close to left and right sides of the water-cooling plate 2. Each of the notches 21 penetrates the water-cooling plate 2 in the thickness direction and extends in the front-back direction. Furthermore, three hole portions 24 are circumferentially formed at positions close to the front side of the water-cooling plate 2 in the front-back direction. Elevating pins 44 installed in a heating part 4 (which will be described later) are raised and lowered through the respective hole portions 24. In addition, a leak sensor 25 for detecting leakage of water from the cooling passage 22 is installed on an upper surface of the water-cooling plate 2.

Returning to FIG. 1, a cooling plate 3 as a cooling plate for cooling the wafer W, and a heating part 4 for heating the wafer W are arranged and installed above the water-cooling plate 2 sequentially from the front side to the back side when viewed from the loading/unloading port 11. The cooling plate 3 and the heating part 4 are fixed to the upper surface of the water-cooling plate 2 through support members 38 and 48, respectively. Accordingly, it can be said that the water-cooling plate 2 is installed across a region below the cooling plate 3 and a heating plate 40 (to be described later) in the heating part 4.

Figure 4:
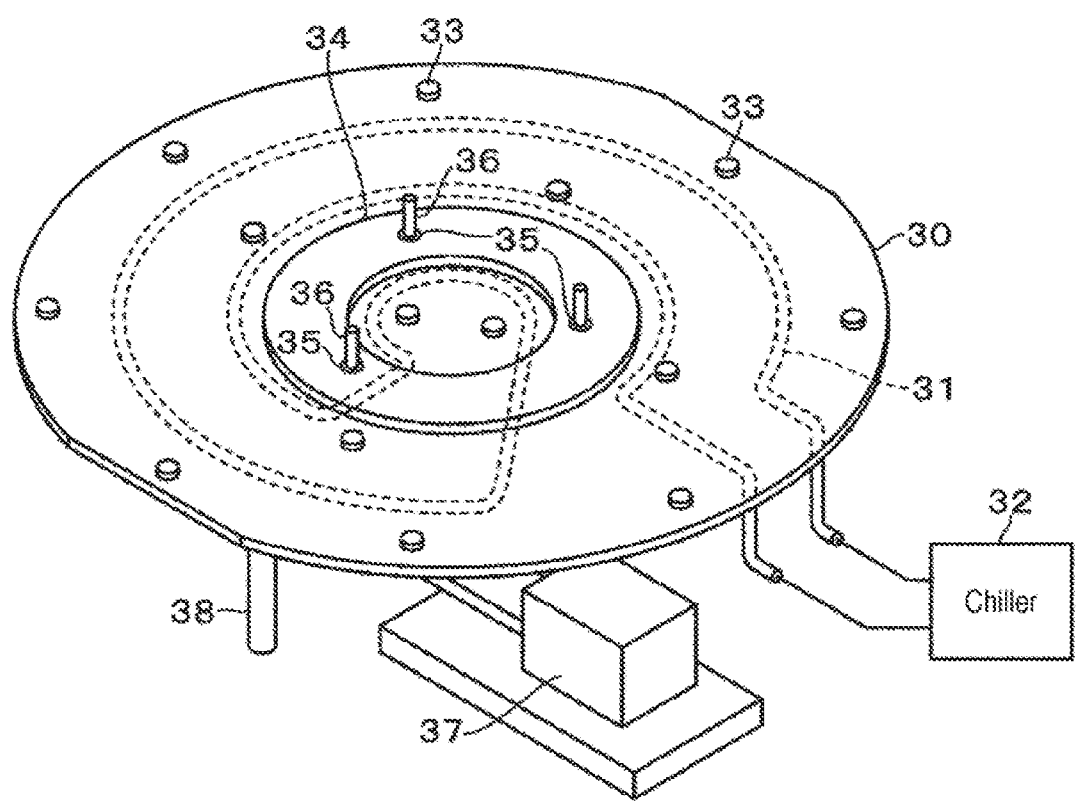
FIG. 4 is a perspective view illustrating a cooling plate.

The cooling plate 3 will be described with reference to FIGS. 4 and 5. As illustrated in FIG. 4, the cooling plate 3 includes a disc-shaped metal plate 30. A cooling passage 31 is formed so as to be circulated around the entire lower surface of the metal plate 30. Furthermore, in FIGS. 1 and 5, only the metal plate 30 is shown for the sake of avoiding complexity of the figures. A chiller 32 is connected to the cooling passage 31 so that, for example, cooling water flows through the cooling passage 31. Thus, the wafer W mounted on the metal plate 30 is cooled down.

In addition, on the surface of the cooling plate 3, for example, fifteen gap pins 33 for keeping a constant gap between the wafer W and the cooling plate 3 are dispersedly arranged on the surface of the cooling plate 3. Further, an annular convex portion 34 that surrounds the center of the cooling plate 3 is formed on the surface of the cooling plate 3. The convex portion 34 is installed to ensure that the central portion of the wafer W makes contact with the cooling plate 3 even if the wafer W is being wrapped. The convex portion 34 is also formed in an annular shape in order to avoid locally cooling only the central portion of the wafer W.

Figure 5:
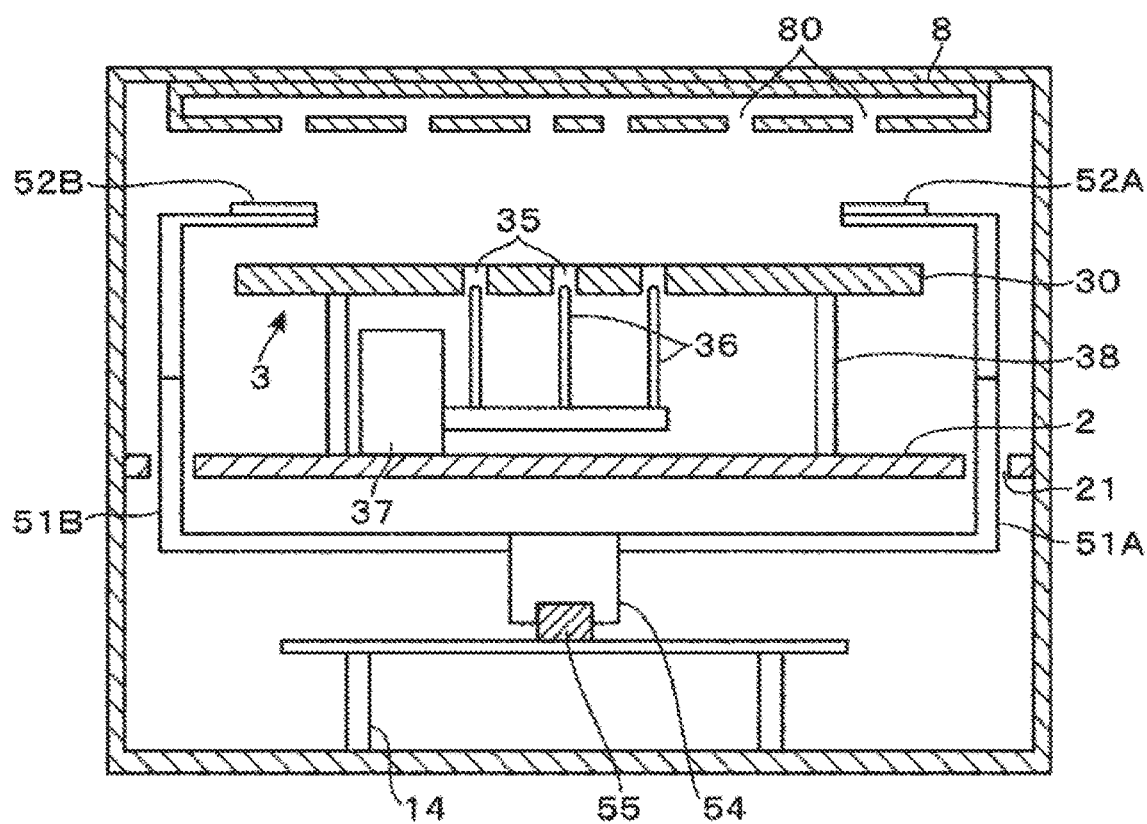
FIG. 5 is a longitudinal front view illustrating the cooling plate in the heating device.

As illustrated in FIGS. 4 and 5, three through holes 35 are circumferentially formed to penetrate through the cooling plate 3 in the thickness direction. Elevating pins 36 as elevating members are respectively disposed in the through holes 35. The elevating pins 36 are raised and lowered by an elevating mechanism 37 and move upward and downward on the surface of the cooling plate 3. Further, the elevating mechanism 37 may be fixed to the water-cooling plate 2 so that it can be cooled down by the water-cooling plate 2.

Figure 6:
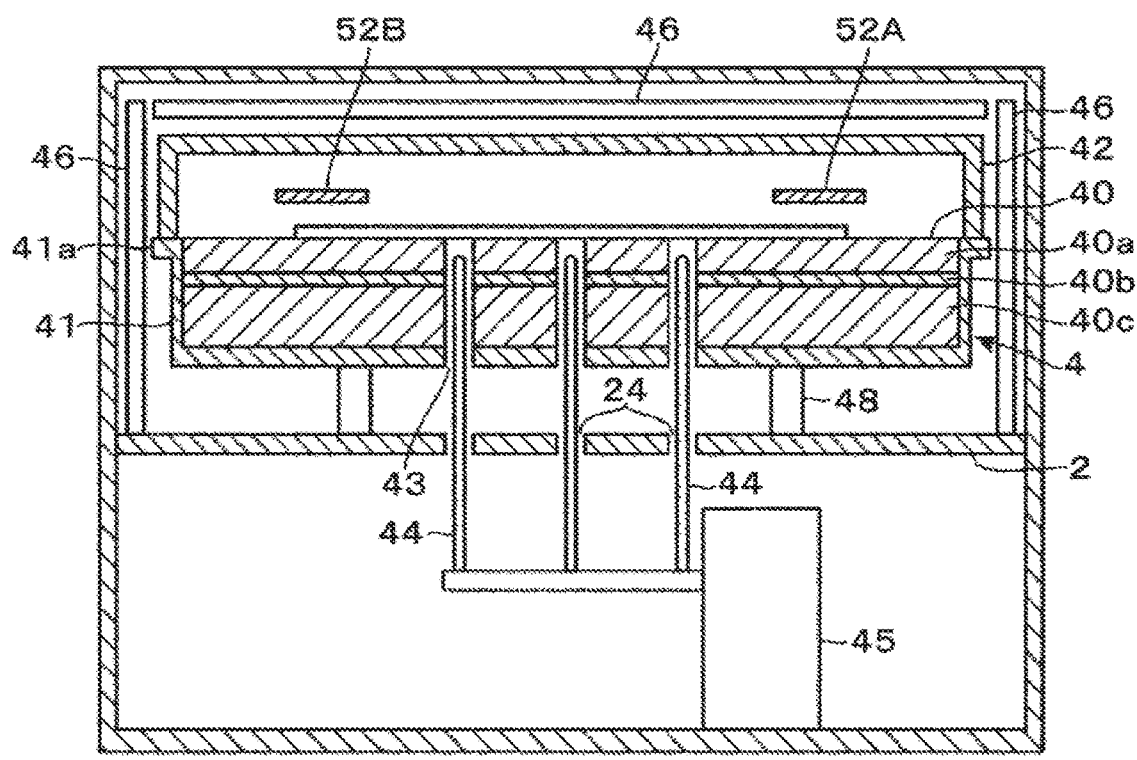
FIG. 6 is a longitudinal front view illustrating a heating part in the heating device.

The heating part 4 will be described with reference to FIGS. 1, 2 and 6. The heating part 4 includes a heating plate 40 on which the wafer W is mounted, a lower member 41 for accommodating the heating plate 40, and a ceiling plate member 42 configured to surround the wafer W mounted on the heating plate 40 from left, right and upper sides and to be opened in the front-back direction.

The heating plate 40 has a flat cylindrical shape and is configured by sequentially stacking a heat insulating plate 40c, a plate-shaped heater 40b, and a surface member 40a such as silicon carbide in the named order from the bottom. For example, gap pins (not shown) for supporting the wafer W at a certain distance from the surface of the heating plate 40 are dispersedly installed on the upper surface of heating plate 40. The lower member 41 has, for example, a cylindrical shape and flat bottom. In addition, a flange 41a is formed in an upper end portion of the lower member 41. The flange 41a regulates a nitrogen gas such that the nitrogen gas flows along the surface of the heating plate 40. Three through holes 43 which penetrate through the heating plate 40 and lower member 41 in the thickness direction are circumferentially formed in the heating plate 40 and lower member 41. Elevating pins 44 are disposed in the respective through holes 43.

The elevating pins 44 are respectively inserted into the hole portions 24 formed in the water-cooling plate 2 and are connected to an elevating mechanism 45 which is installed below the water-cooling plate 2 and on an upper surface of a bottom plate of the housing 10. The elevating pins 44 are raised and lowered by the elevating mechanism 45 so as to move upward and downward on the upper surface of the heating plate 40. In addition, as illustrated in FIG. 6, heat insulation panels 46 that suppress heat generated from the heating part 4 from being radiated to the outside of the housing 10 are respectively installed in the vicinity of left and right sidewalls of the heating part 4 and an upper ceiling surface of the ceiling plate member 42 inside the housing 10.

Figure 7:
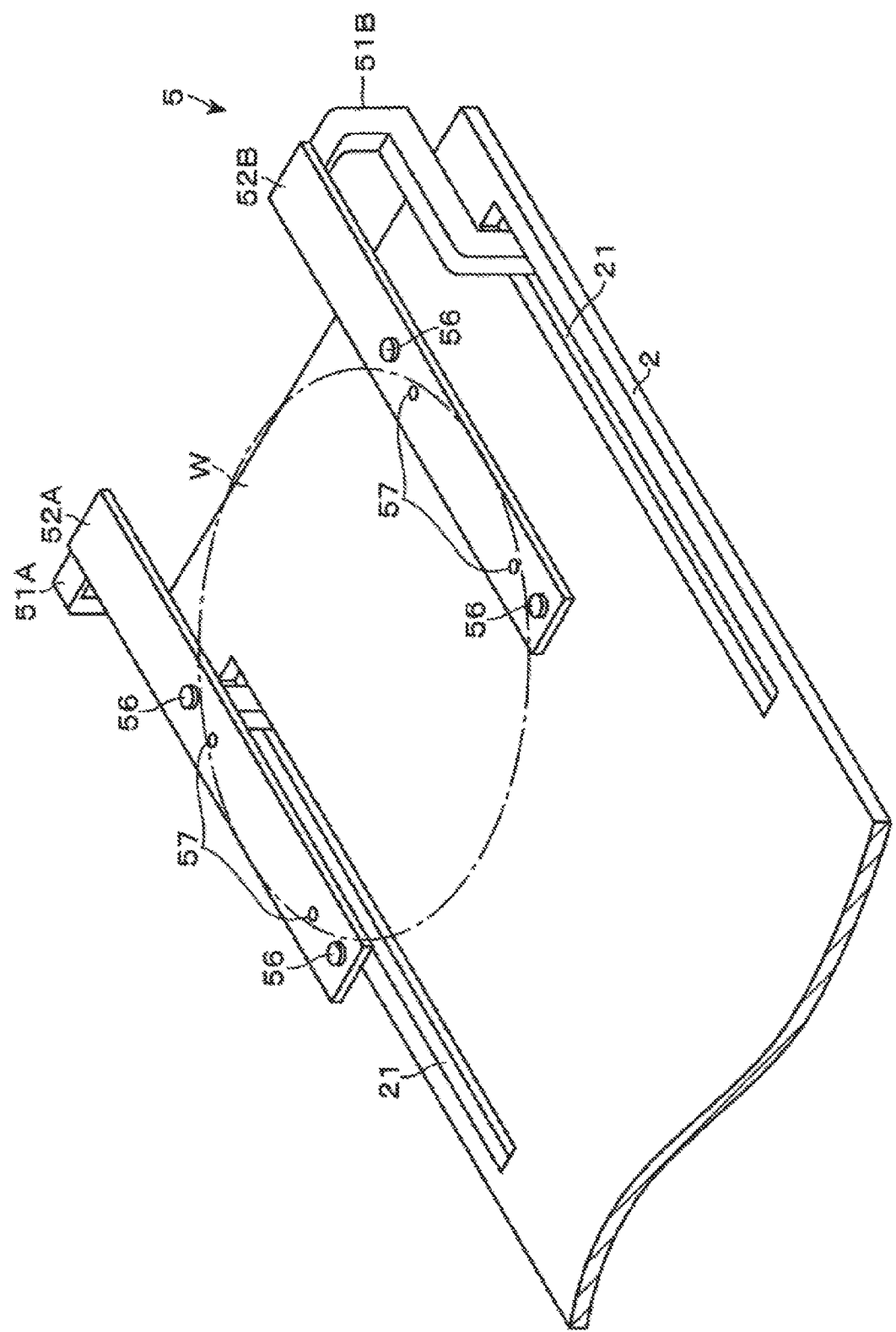
FIG. 7 is a perspective view illustrating a wafer transfer mechanism.

As illustrated in FIG. 1, the heating device 1 further includes a wafer transfer mechanism 5 which is a substrate transfer mechanism for transferring the wafer W between the cooling plate 3 and the heating part 4. The wafer transfer mechanism 5 will be described with reference to FIGS. 1, 2, 5 and 7. In FIG. 7, a portion of the water-cooling plate 2 is illustrated in a simplified manner. As illustrated in FIGS. 5 and 7, support parts 51A and 51B respectively extending upward and downward are installed at left and right sides of the cooling plate 3 so as to face each other. As illustrated in FIGS. 1, 2, 5 and 7, upper end portions of the support parts 51A and 51B are formed to protrude inward in the left-right direction, respectively. Furthermore, a plate-shaped left holding member 52A and a plate-shaped right support member 52B are respectively installed on leading ends of the upper end portions of the support parts 51A and 51B. The plate-shaped left holding member 52A and the plate-shaped right support member 52B are made of, for example, ceramic or quartz, and extend toward the heating part 4 (toward the back side) when viewed from the cooling plate 3 to support a left peripheral portion and a right peripheral portion of the lower surface of the wafer W, respectively.

As illustrated in FIG. 7, popping prevention pins 56 and gap pins 57 on which the wafer W is mounted are installed on upper surfaces of the left holding member 52A and the right support member 52B. The popping prevention pins 56 are installed in front and back sides of a position at which the wafer W is held to prevent the wafer W from popping out of the position. In this example, a combination of the support parts 51A and 51B, the left holding member 52A and the right support member 52B constitutes a substrate holding part.

As illustrated in FIG. 7, in the wafer transfer mechanism 5, the support parts 51A and 51B are respectively inserted into the notches 21 formed in the water-cooling plate 2. As illustrated in FIGS. 1 and 5, base end portions of the support parts 51A and 51B are connected to a common moving mechanism 54 installed below the water-cooling plate 2. The moving mechanism 54 is configured to move along a guide rail 55 extending in the front-back direction below the water-cooling plate 2 by, for example, a belt driving mechanism (not shown) or the like. Furthermore, in the drawing, reference numeral 14 denotes a base part for adjusting the height of the guide rail 55. By moving the moving mechanism 54 along the guide rail 55, the left holding member 52A and the right holding member 52B are moved between a position above the cooling plate 3 indicated by a solid line in FIGS. 1 and 2 and a position above the heating plate 40 indicated by a broken line in FIGS. 1 and 2. At this time, as illustrated in FIG. 6, when the left holding member 52A and the right holding member 52B are located above the heating plate 40, the left holding member 52A and the right holding member 52B are inserted between the ceiling plate member 42 and the heating plate 40 so that the wafer W is delivered in cooperation between the elevating pins 44 and the wafer transfer mechanism 5.

Returning to FIG. 1, a first gas supply part 7 for forming a one-way flow of, for example, a nitrogen ($N_2$) gas, as an inert gas for forming a low oxygen atmosphere on the surface of the heating plate 40A is installed above the back side (the side of the heating part 4) of the cooling plate 3 in the front-back direction.

As illustrated in FIGS. 1 and 2, the first gas supply part 7 includes a cylindrical tubular portion 70 which is disposed so as to extend in the left-right direction, and a plurality of discharge holes 70a for discharging a gas toward the surface of the heating plate 40 are formed in a side surface of the tubular portion 70 in a longitudinal direction of the tubular portion 70. Furthermore, as illustrated in FIG. 1, one end of a gas supply passage 71 is connected to the tubular portion 70, and the other end of the gas supply passage 71 is connected to an $N_2$ gas supply source 72 in which, for example, an $N_2$ gas, is stored. In FIG. 1, reference symbols M71 and V71 denote a flow rate adjustment part and a valve, respectively.

In addition, as illustrated in FIG. 1, a second gas supply part 8 for supplying a low oxygen gas, for example, an $N_2$ gas as an inert gas toward the cooling plate 3 is installed above the cooling plate 3. The second gas supply part 8 is formed of a punching plate having a flat rectangular tubular shape and having a lower surface with a plurality of hole portions 80 formed therein. One end of a gas supply passage 81 is connected to the second gas supply part 8, and the other end of the gas supply passage 81 is connected to the aforementioned $N_2$ gas supply source 72. In FIG. 1, reference symbols M81 and V81 denote a flow rate adjustment part and a valve, respectively.

Furthermore, as illustrated in FIGS. 1 and 2, an exhaust part 15 for exhausting the internal atmosphere of the housing 10 is formed at a position corresponding to the height of the surface of the heating plate 40 in the side surface of the housing 10 in the back direction. The exhaust part 15 is connected to a factory exhaust system.

In addition, as illustrated in FIG. 1, the heating device 1 further includes a control part 9 for controlling the heating device 1. A program stored in a storage medium such as, for example, a compact disc, a hard disk, a magneto-optical (MO) disk, a memory card or the like is installed on the control part 9. The installed program incorporates commands (steps) for allowing a control signal to be transmitted to each part of the heating device 1 and controlling the operation of the heating device 1 illustrated in the description of an operation as described hereinbelow.

Figure 8:
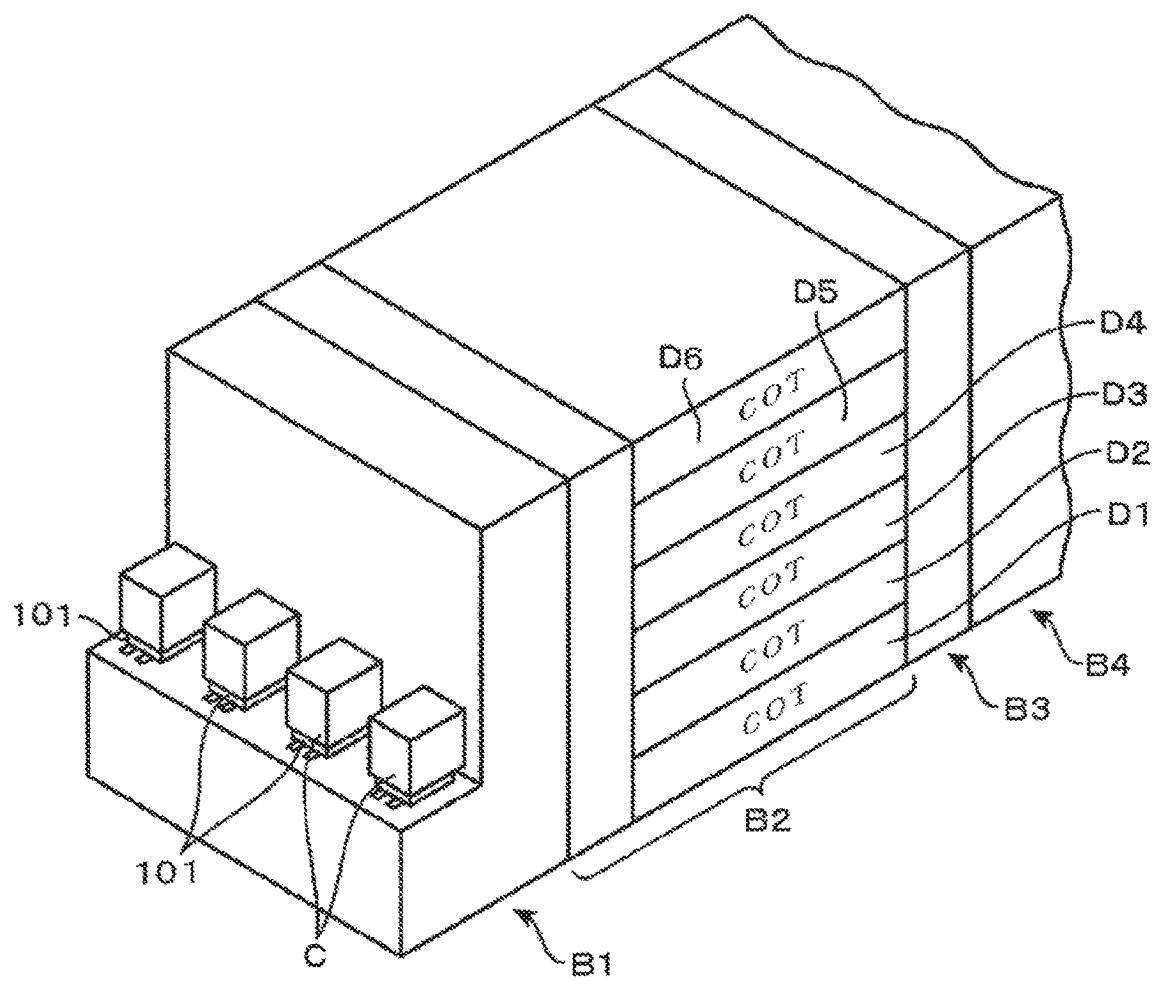
FIG. 8 is a perspective view illustrating a coating-developing apparatus in which the heating device is installed.
Figure 9:
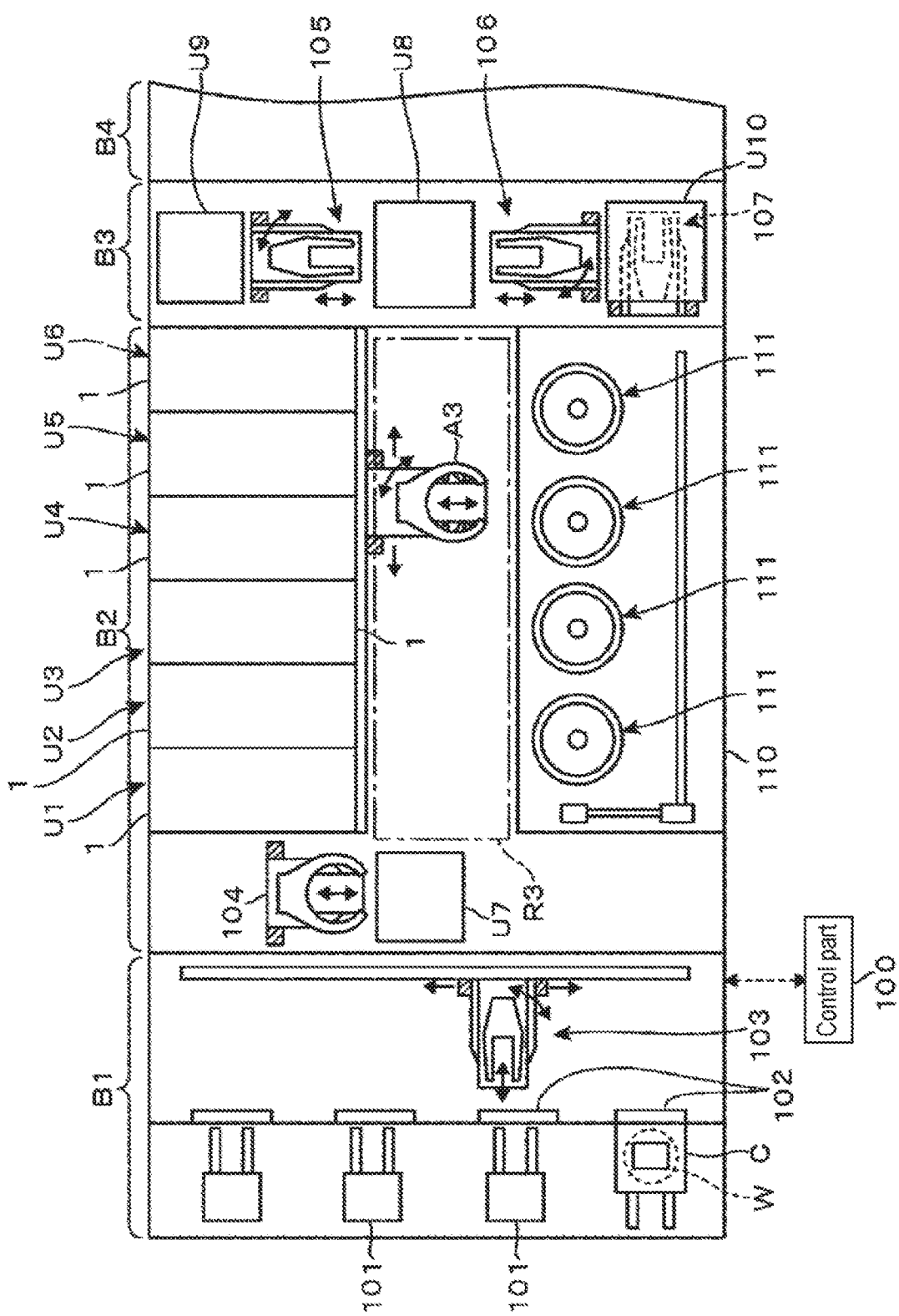
FIG. 9 is a plan view illustrating the coating-developing apparatus in which the heating device is installed.

Next, an overall configuration of a coating-developing apparatus which is a substrate processing apparatus including the aforementioned heating device 1 incorporated therein will be briefly described. As illustrated in FIGS. 8 and 9, the coating-developing apparatus is composed by linearly connecting a carrier block B1, a processing block B2, and an interface block B3. An exposure station B4 is further connected to the interface block B3.

The carrier block B serves to load and unload a plurality of wafers W, each having a diameter of, for example, 300 mm, as a product substrate, from a carrier C (for example, FOUP) which is a transfer vessel that accommodates the plurality of wafers W, into the apparatus. The carrier block B includes mounting stages 101 on which the carriers C are mounted, doors 102, and a transfer arm 103 for transferring the wafer W from the respective carrier C.

The processing block B2 is composed by stacking first to sixth unit blocks D1 to D6 for liquid processing with respect to the wafer W sequentially from the bottom. Each of the unit blocks D1 to D6 has substantially the same configuration except that it includes a coating unit for coating different coating solutions or developing solutions.

The configuration of the unit block D3 is representatively illustrated in FIG. 9. For example, a coating unit 110 for coating the wafer W with an SOC film, including a transfer arm A3 which moves along a linear transfer region R3 from the side of the carrier book B1 toward the interface block B3, and cup modules 111, is installed in the unit block D3. The heating devices 1 of the present disclosure are also stacked on respective shelf units U1 to U6.

A shelf unit U7 composed by a plurality of modules stacked above another is installed in the vicinity of the transfer region R3 facing the carrier block B1. The transfer of the wafer W between the transfer arm 103 and the transfer arm A3 is performed through the transfer module of the shelf unit U7 and the transfer arm 104.

The interface block B3 serves to transfer the wafer W between the processing block B2 and the exposure station B4, and includes shelf units U8, U9 and U10 in which a plurality of processing modules are stacked one above another. Furthermore, in FIG. 9, reference numerals 105 and 106 denotes transfer arms for transferring the wafer W between the shelf units U8 and U9 and between the shelf units U9 and U10, respectively. In FIG. 9, reference numeral 107 denotes a transfer arm for transferring the wafer W between the shelf unit U10 and the exposure station B4.

An outline of a transfer path of the wafer W in a system including the coating-developing apparatus and the exposure station B4 will be briefly described. The wafer W is transferred in order of the carrier C→the transfer arm 103→the transfer module of the shelf unit U7→the transfer arm 104→the transfer module of the shelf unit U7→the unit block D1 (D2)→the unit block D3 (D4)→the interface block B3→the exposure station B4→the interface block B3→the unit block D5 (D6)→the transfer module TRS of the shelf unit U7→the transfer arm 103→the carrier C.

Figure 10:
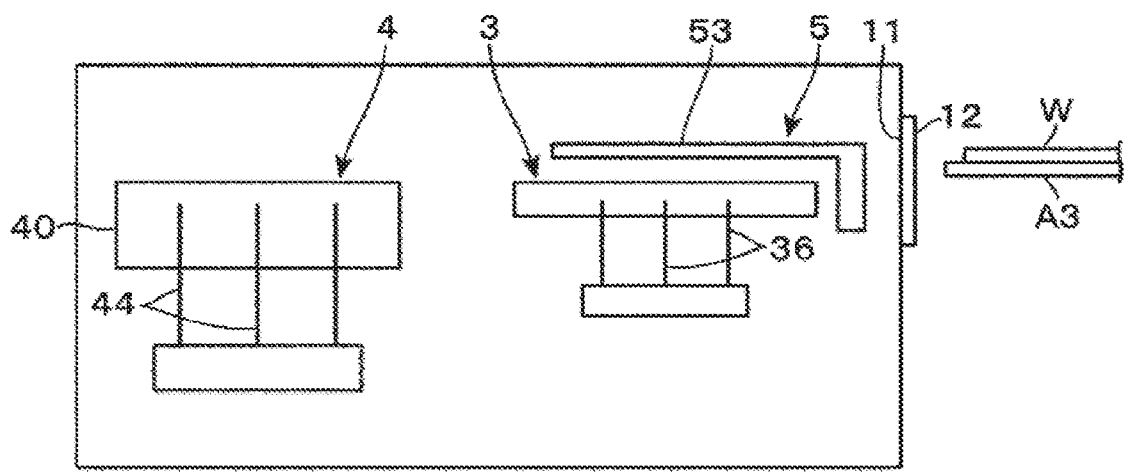
FIG. 10 is an explanatory view illustrating an operation of the heating device according to the first embodiment.

Next, an operation of the heating device according to the embodiment of the present disclosure will be described with reference to schematic views of FIGS. 10 to 24. For example, the wafer W coated with an SOC film by the coating unit 110 is picked up and held by the transfer arm A3 from the coating unit 110, as illustrated in FIG. 10. At this time, the heating plate 40 of the heating part 4 is heated to, for example, 600 degrees C. and cooling water flows through the cooling plate 3. Furthermore, in FIGS. 10 to 24, although the cooling water flows through the water-cooling plate 2, illustration thereof is omitted. In addition, the wafer transfer mechanism 5 waits above the cooling plate 3.

Figure 11:
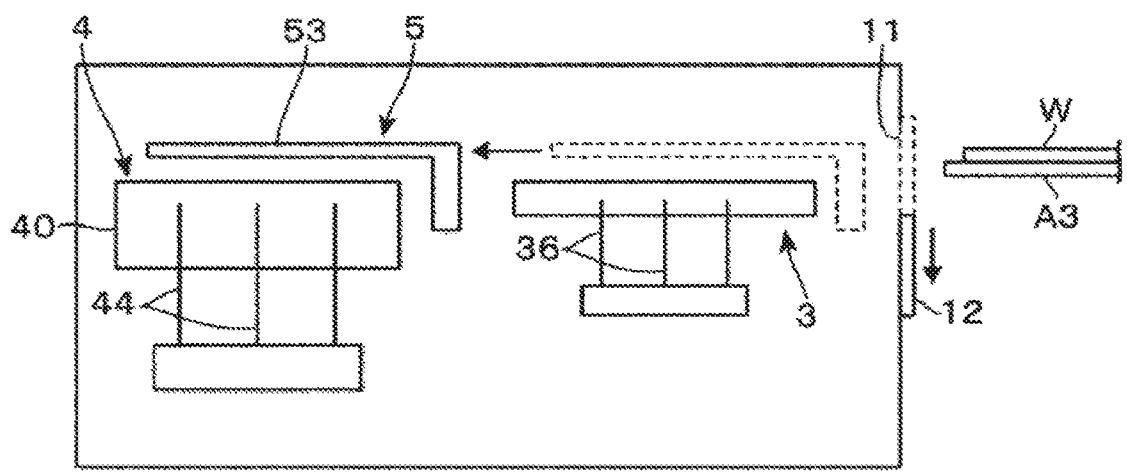
FIG. 11 is an explanatory view illustrating an operation of the heating device according to the first embodiment.
Figure 12:
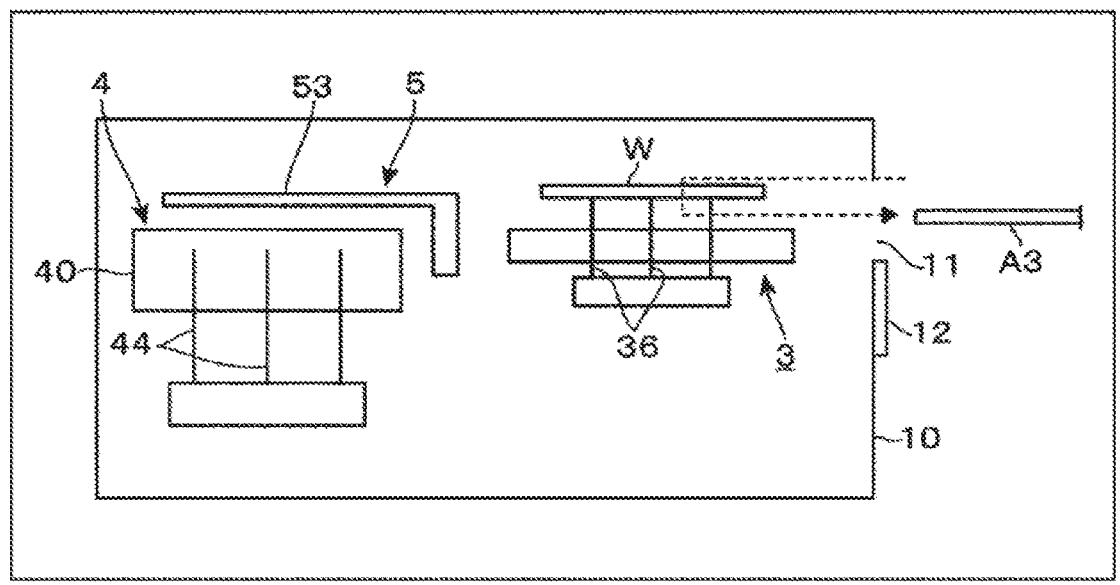
FIG. 12 is an explanatory view illustrating an operation of the heating device according to the first embodiment.

Subsequently, as illustrated in FIG. 11, the shutter 12 is opened and the wafer transfer mechanism 5 is moved to the side of the heating part 4. Furthermore, as illustrated in FIG. 12, the transfer arm A3 holding the wafer W enters the heating device 1, and subsequently the elevating pins 36 in the side of the cooling plate 3 are raised to receive the wafer W held by the transfer arm A3. Thereafter, the transfer arm A3 is withdrawn from the heating device 1 and the shutter 12 is closed.

Figure 13:
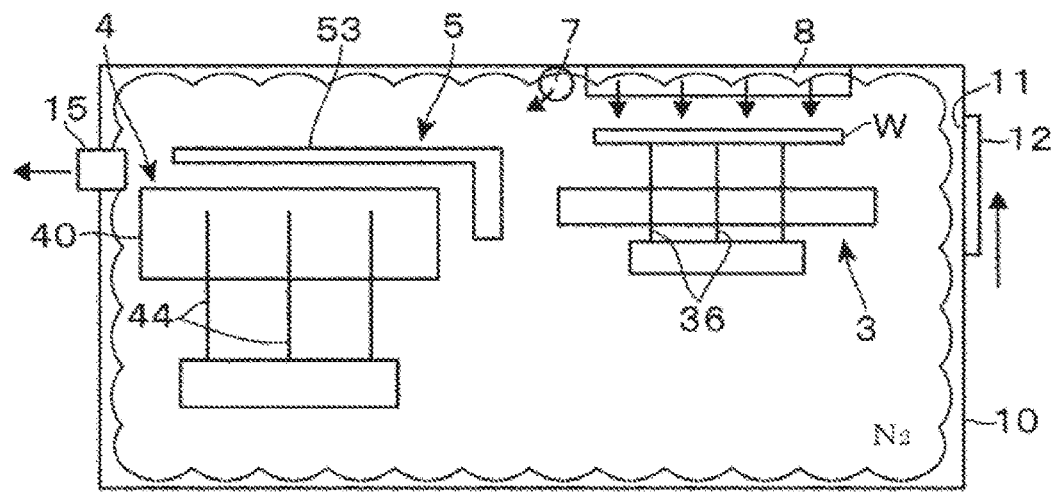
FIG. 13 is an explanatory view illustrating an operation of the heating device according to the first embodiment.
Figure 14:
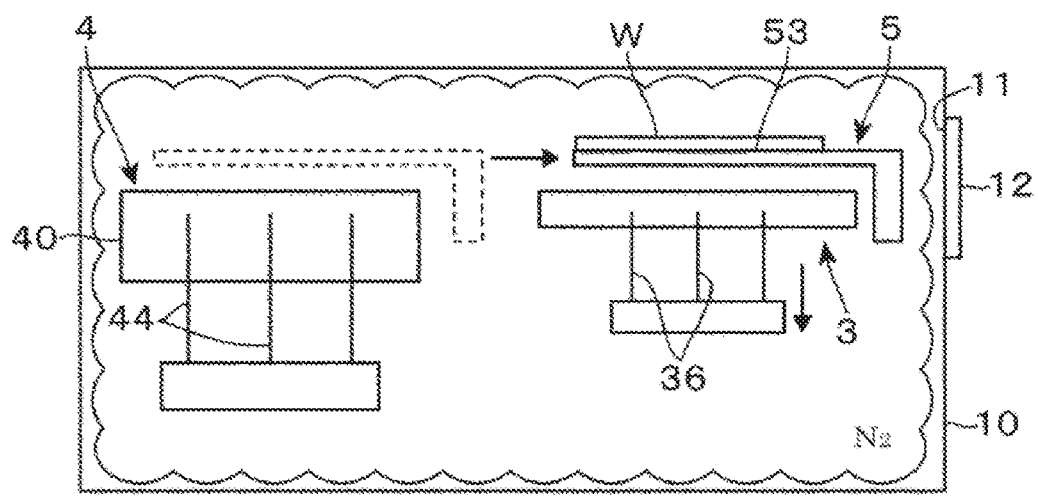
FIG. 14 is an explanatory view illustrating an operation of the heating device according to the first embodiment.

Subsequently, as illustrated in FIG. 13, an $N_2$ gas starts to be discharged from the first gas supply part 7 and the second gas supply part 8 and starts to be exhausted from the exhaust part 15. Even in FIGS. 14 to 18 shown below, although the discharge of the $N_2$ gas from the first gas supply part 7 and the second gas supply part 8 and the exhaust of the $N_2$ gas from the exhaust part 15 continue, illustrations of the first gas supply part 7, the second gas supply part 8, and the exhaust part 15 are omitted. Therefore, the interior of the housing 10 is filled with the $N_2$ gas during the discharge and exhaust period, and an atmosphere in which the wafer W is mounted becomes a low oxygen atmosphere. Subsequently, as illustrated in FIG. 14, the wafer transfer mechanism 5 is moved to the side of the cooling plate 3, and the elevating pins 36 of the cooling plate 3 are lowered to deliver the wafer W to the wafer transfer mechanism 5.

Figure 15:
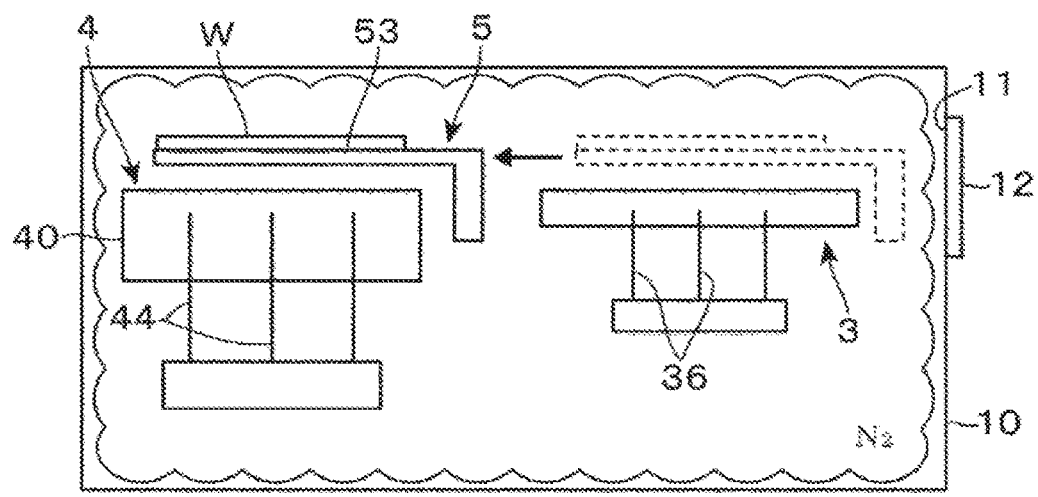
FIG. 15 is an explanatory view illustrating an operation of the heating device according to the first embodiment.
Figure 16:
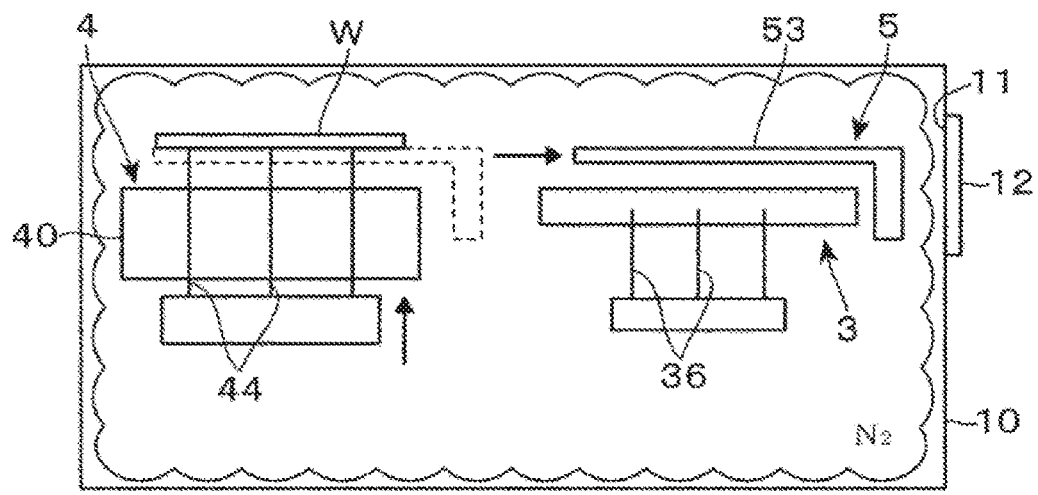
FIG. 16 is an explanatory view illustrating an operation of the heating device according to the first embodiment.
Figure 17:
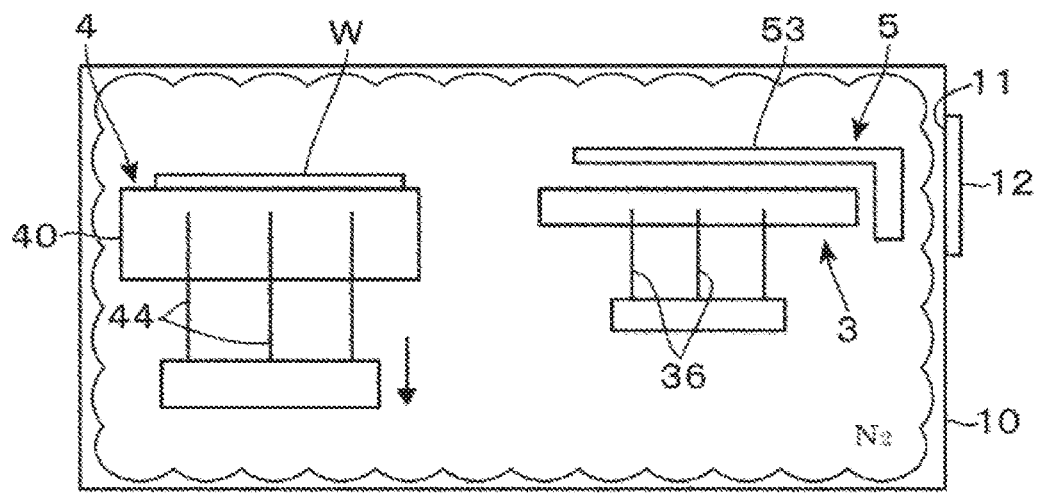
FIG. 17 is an explanatory view illustrating an operation of the heating device according to the first embodiment.

Thereafter, as illustrated in FIG. 15, the wafer transfer mechanism 5 is moved to the side of the heating part 4 while holding both the left and right edge portions of the wafer W. Furthermore, as illustrated in FIG. 16, the elevating pins 44 of the heating part 4 are raised to push up and receive the wafer W, and the wafer transfer mechanism 5 is moved above the cooling plate 3. Subsequently, as illustrated in FIG. 17, the elevating pins 44 are lowered to mount the wafer W on the heating plate 40, and the wafer W is heated for, for example, 60 seconds.

Figure 18:
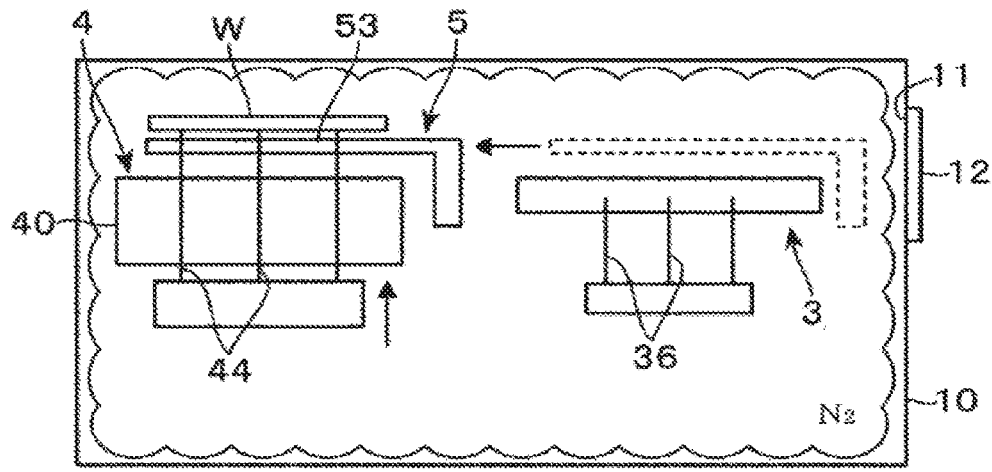
FIG. 18 is an explanatory view illustrating an operation of the heating device according to the first embodiment.

Subsequently, upon completion of the heating of the wafer W, as illustrated in FIG. 18, the wafer W is pushed up by the elevating pins 44 installed in the heating part 4, the wafer transfer mechanism 5 is moved to the side of the heating part 4. The wafer W is transferred to the wafer transfer mechanism 5 in cooperation between the elevating pins 44 and the wafer transfer mechanism 5.

Figure 19:
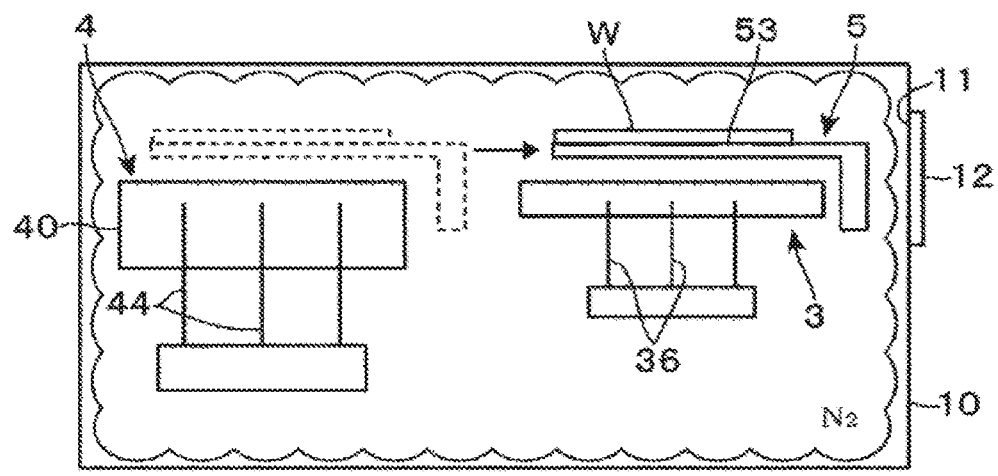
FIG. 19 is an explanatory view illustrating an operation of the heating device according to the first embodiment.
Figure 20:
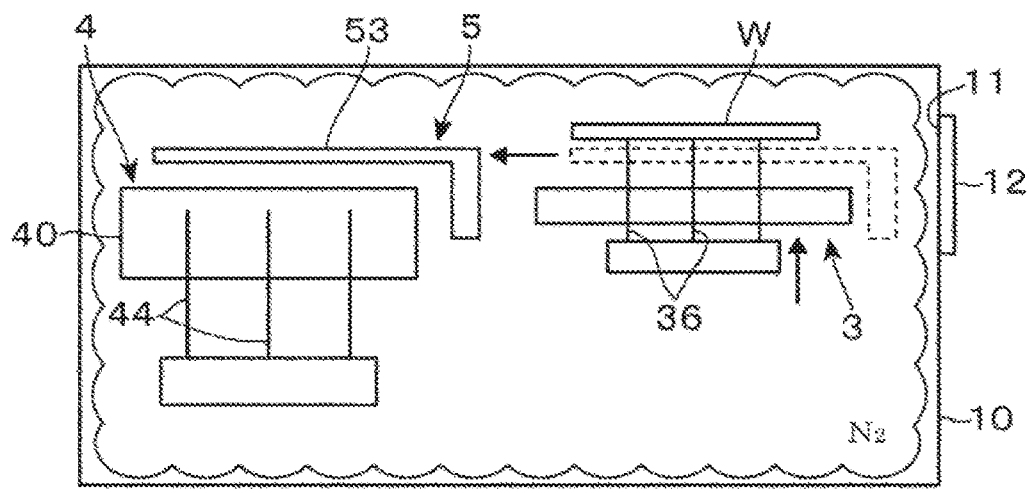
FIG. 20 is an explanatory view illustrating an operation of the heating device according to the first embodiment.
Figure 21:
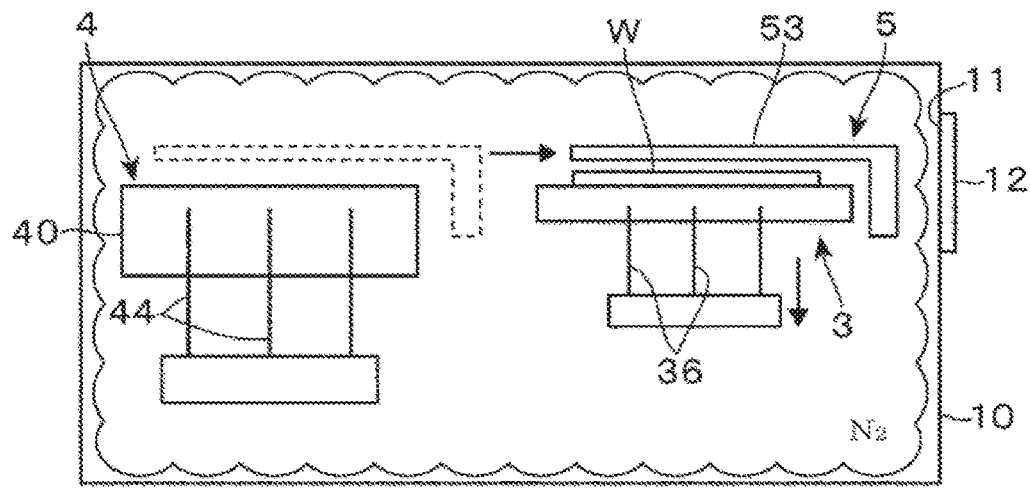
FIG. 21 is an explanatory view illustrating an operation of the heating device according to the first embodiment.

Subsequently, as illustrated in FIG. 19, the wafer transfer mechanism 5 is moved above the cooling plate 3 while holding the wafer W. As illustrated in FIG. 20, the wafer W is then pushed up by the elevating pins 36 of the cooling plate 3, and the wafer transfer mechanism 5 is moved to the side of the heating part 4. Thereafter, as illustrated in FIG. 21, the elevating pins 36 are lowered to mount the wafer W on the cooling plate 3. Furthermore, the wafer transfer mechanism 5 is moved to the side of the heating part 4. The wafer W is promptly moved above the cooling plate 3 after the mounting of the wafer W on the cooling plate 3. Then, the wafer W is cooled down for, for example, 70 seconds. Accordingly, the wafer W is cooled down to 110 degrees C.

Figure 22:
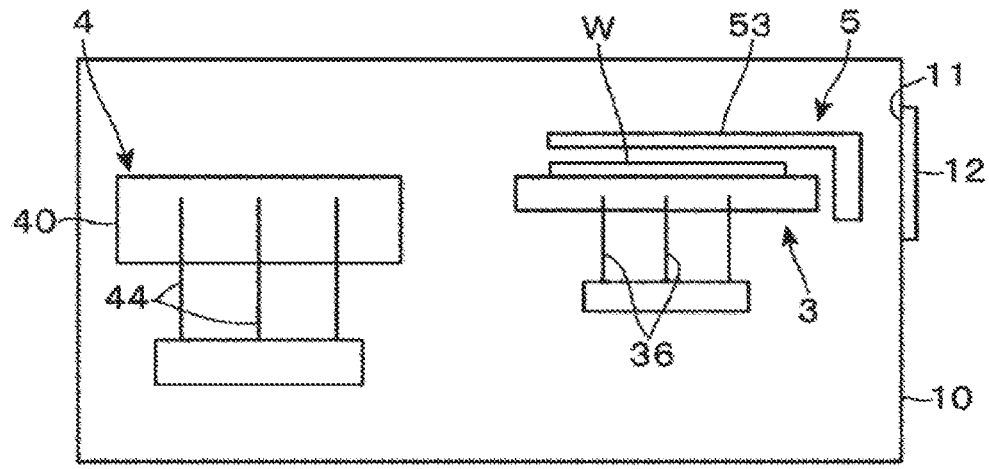
FIG. 22 is an explanatory view illustrating an operation of the heating device according to the first embodiment.
Figure 23:
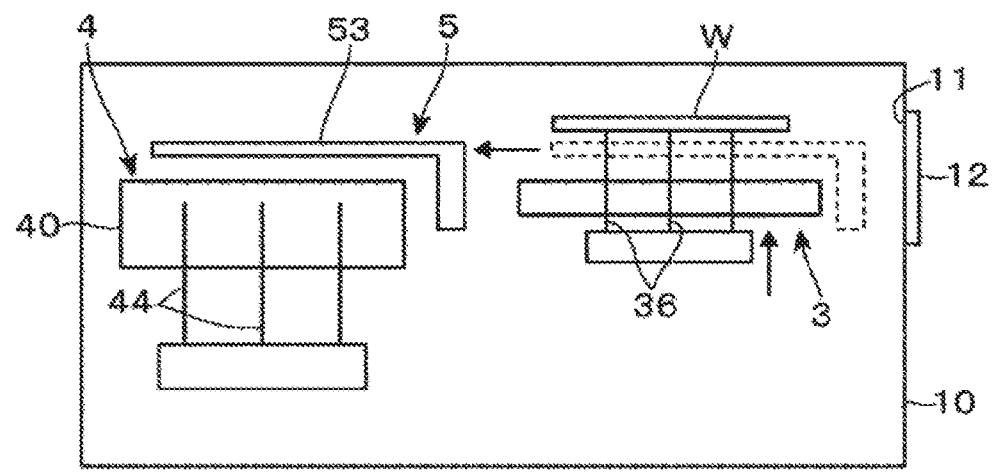
FIG. 23 is an explanatory view illustrating an operation of the heating device according to the first embodiment.
Figure 24:
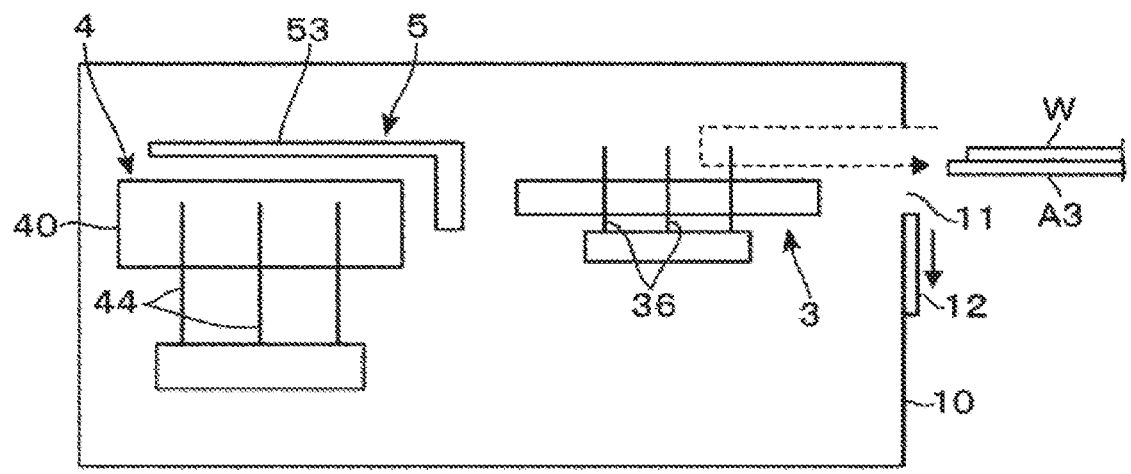
FIG. 24 is an explanatory view illustrating an operation of the heating device according to the first embodiment.

After the wafer W is cooled, as illustrated in FIG. 22, the supply of the $N_2$ gas from the first gas supply part 7 and the second gas supply part 8 is stopped, and the exhaust of the $N_2$ gas from the exhaust part 15 is stopped. Thereafter, as illustrated in FIG. 23, the wafer transfer mechanism 5 is moved to the side of the heating part 4, and the elevating pins 36 are raised to push up the wafer W mounted on the cooling plate 3. Furthermore, as illustrated in FIG. 24, the shutter 12 is opened, and the transfer arm A3 enters the heating device 1. The wafer W is transferred to the transfer arm A3 in cooperation between the elevating pins 36 and the transfer arm A3.

Thereafter, the wafer W is unloaded from the heating device 1 by the transfer arm A3. The elevating pins 36 are lowered, and the shutter 12 is closed. Furthermore, the wafer transfer mechanism 5 is moved to the side of the cooling plate and enters a stand mode.

In the aforementioned embodiment, the wafer W, heated by the heating plate 40 is transferred to the cooling plate 3 by the wafer transfer mechanism 5. The moving mechanism 54 configured as, for example, a belt driving mechanism for transferring the wafer W, is disposed below the water-cooling plate 2 which is provided across a region below the heating plate 40 and the cooling plate 3. In addition, the moving mechanism 54 and the guide rail 55 of the wafer transfer mechanism 5 are disposed so as to avoid a place just below the heating part 4 as much as possible. Therefore, even if the temperature of the heating plate 40 is as high as 600 degrees C., since heat radiated from the heating plate 40 is blocked by the water-cooling plate 2, the heat resistance to the moving mechanism 54 is increased.

Furthermore, by disposing the elevating mechanism 45 related to the elevating pins 44 installed in the heating part 4 below the water-cooling plate 2, it is possible to suppress the heat radiated from the heating part 4 from reaching the elevating mechanism 45.

In addition, the lower surfaces of the left peripheral portion and the right peripheral portion of the wafer W are held by the left holding member 52A and the right holding member 52B which are respectively installed to extend in the front-back direction with respect to the support parts 51A and 51B extending inward of the cooling plate 3 in the left-right direction. Therefore, the left holding member 52A and the right holding member 52B do not interfere with the elevating pins 36 installed in the cooling plate 3 and the elevating pins 44 installed in the heating plate in a plan view. Furthermore, it is only necessary to form the through holes 35 of the elevating pins 36 without forming notches in the cooling plate 3. Thus, the wafer W can be quickly cooled with high uniformity.

In addition, in a case where the wafer W is held only at one side thereof, there may be a case where the wafer W is inclined due to its own weight, increasing the displacement of the position of the wafer W. Therefore, it is possible to hold the wafer W in a stable posture by holding the right and left peripheral edges of the lower surface of the wafer W with both the left holding member 52A and the right holding member 52B.

Furthermore, two plate-shaped holding members, left holding member 52A and right holding member 52B, are used to hold the wafer W by the wafer transfer mechanism 5 in the left-right direction. The left holding member 52A and the right holding member 52B enter above the heating plate 40 having a high temperature. Thus, for example, a member such as ceramics or quartz may be used for the left holding member 52A and the right holding member 52B. However, members made of such materials make it difficult to form complicated shapes such as a slit that is used to avoid interference of the elevating pines 36 and 44 and the wafer transfer mechanism 5 with each other. In the aforementioned embodiment, since the left holding member 52A and the right holding member 52B are formed in two plate shaped sheets, the members can be easily formed into a variety of shapes even if they are made of ceramics or quartz.

Furthermore, as described above, the heat load borne by the driving part becomes larger as the heating device 1 has a higher temperature. Thus, by applying the present disclosure to a heating device for performing a heating process at a high temperature, for example, a temperature of 450 degrees C. or higher, it is possible to achieve more effects.

Moreover, when the wafer W is not loaded into the heating device 1, when the wafer W is heated, and when the wafer W is cooled down, the wafer transfer mechanism 5 is moved to the side of the cooling plate 3. If the wafer transfer mechanism 5 is located at the side of the heating part 4, the wafer transfer mechanism 5 may accumulate the heat radiated from the heating part 4, which may cause a failure or shorten the maintenance cycle. Therefore, when the wafer W is not loaded into the heating device 1, when the wafer W is heated, and when the wafer W is cooled down, it is necessary to move the wafer transfer mechanism 5 to the side of the cooling plate 3.

In addition, the heating part 4 is not limited to a configuration in which a one-way flow is formed on the surface of the wafer W, but it may have a configuration in which an air flow is introduced from the periphery of the wafer W mounted on the heating plate 40 and is exhausted from the center of a ceiling plate part. Alternatively, a gas constituting a processing atmosphere may be supplied from above the wafer W and may be exhausted from below around the wafer W.

However, in forming an $N_2$ gas atmosphere on the surface of the wafer W, by forming a one-way flow flowing from the one side to the other side of the surface of the wafer W, it is possible to control the in-plane uniformity in the temperature of the wafer W, to suppress the concentration of oxygen in the surface of the wafer W, and to suppress deterioration in removal capacity of sublimate. Furthermore, the ceiling plate member 42 facing the heating plate 40 is formed in a single plate shaped sheet. Thus, the maintainability is good and the ceiling plate member 42 is also easy-to-work. Accordingly, it is easy to use a material having high heat resistance such as ceramic or quartz as described above.

In addition, it is necessary to perform the heating of the wafer W in a low oxygen concentration atmosphere having lower oxygen concentration than in the air atmosphere, for example, in an atmosphere in which the oxygen concentration is 400 ppm or less, specifically 50 ppm or less. An example of the low oxygen concentration atmosphere may include an inert gas atmosphere such as a nitrogen gas.

Second Embodiment

Figure 25:
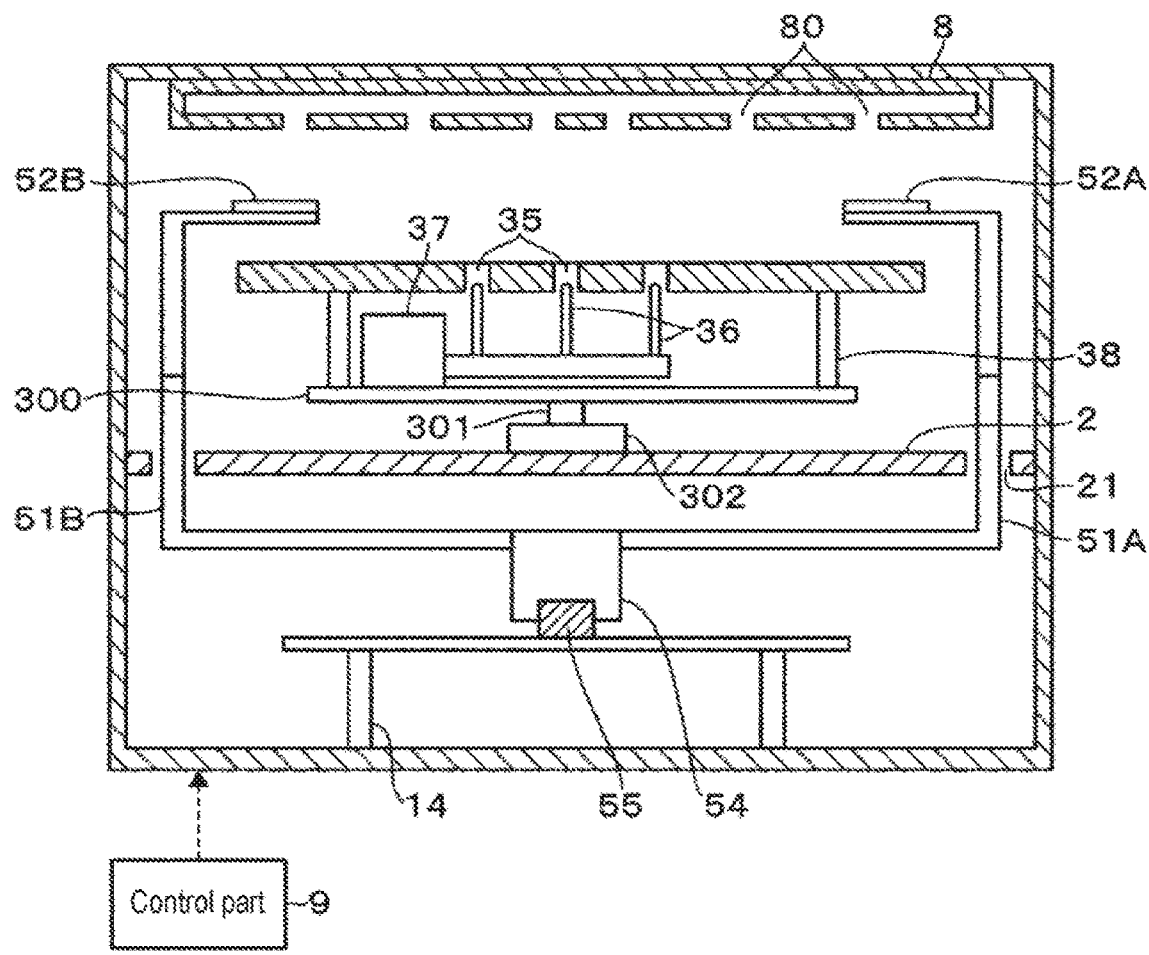
FIG. 25 is a longitudinal front view illustrating a heating device according to a second embodiment of the present disclosure.

Furthermore, a rotary mechanism for rotating the cooling plate 3 around a vertical axis may be installed, and a wafer W may be heated while changing an angle at which the wafer W is mounted. For example, as illustrated in FIG. 25, the cooling plate 3, the elevating pins 36, and the elevating mechanism 37 are installed on a turntable 300, and the turntable 300 is connected to a rotary mechanism 302 installed on the water-cooling plate 2 through a rotary shaft 301. Accordingly, the cooling plate 3, the elevating pins 36, and the elevating mechanism 37 integrally rotate around the vertical axis. In addition, a program storage part for storing a program including a group of steps for executing processes illustrated in an operation of the heating device 1 as described hereinbelow is installed in the control part 9.

Since the cooling passage 31 connected to the chiller 32 is formed in the cooling plate 3, a rotation angle of the cooling plate 3 is restricted. However, the cooling plate 3 may be configured to be rotated by, for example, 90 degrees, by forming the cooling passage 31 in a bendable structure.

An operation of the heating device 1 according to a second embodiment of the present disclosure will be described. In FIGS. 26 to 29, a notch N, as illustrated, is used to check a mounting angle of the wafer W.

Figure 28:
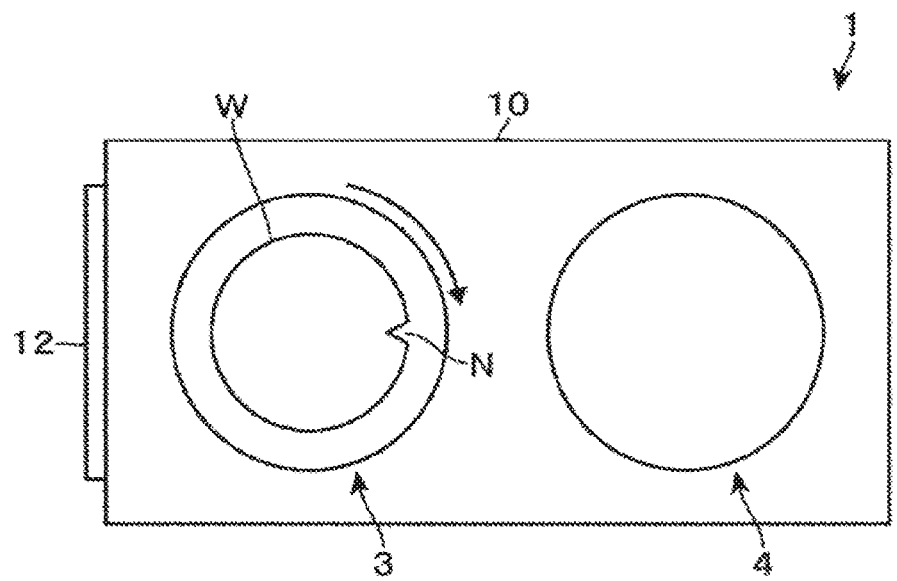
FIG. 28 is an explanatory view illustrating an operation of the heating device according to the second embodiment.

In the heating device 1 according to the second embodiment, as illustrated in FIG. 26, the wafer W carried into the heating device 1 is initially transferred to the heating part 4 and mounted on the heating plate 40, as in the first embodiment. Subsequently, after heating the wafer W for, for example, 15 seconds, the wafer W is transferred to the wafer transfer mechanism 5. The wafer W is mounted on the cooling plate 3 in cooperation between the wafer transfer mechanism 5 and the elevating pins 36 of the cooling plate 3, as illustrated in FIG. 27. Subsequently, as illustrated in FIG. 28, the cooling plate 3 is rotated by, for example, 90 degrees, in a clockwise direction. In this state, the wafer W is pushed up by the elevating pins 36 and transferred to the wafer transfer mechanism 5. Furthermore, the wafer W is transferred to the heating part 4 by the wafer transfer mechanism 5. The wafer W is mounted on the heating part 4 in cooperation between the wafer transfer mechanism 5 and the elevating pins 44. Furthermore, in the case where the rotation angle of the cooling plate 3 is limited to, for example, 90 degrees, after the wafer W is transferred from the cooling plate 3 to the wafer transfer mechanism 5, the cooling plate 3 may be rotated by 90 degrees in a counterclockwise direction and returned to the initial position.

Figure 29:
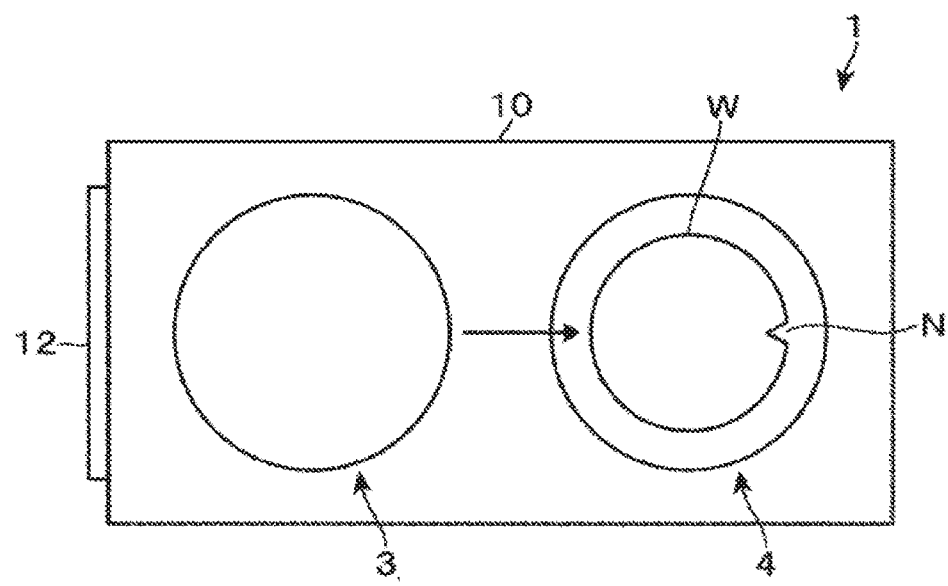
FIG. 29 is an explanatory view illustrating an operation of the heating device according to the second embodiment.

At this time, after the wafer W is heated once, the wafer W is rotated by 90 degrees at the cooling plate 3 and then mounted on the heating plate 40 again. Therefore, as illustrated in FIG. 29, the wafer W is mounted on the heating plate 40 while being rotated by 90 degrees and is heated for 15 seconds, as compared with the initial heating state. In this manner, the process of mounting the wafer W on the heating plate 40 and heating the wafer W for 15 seconds and the process of mounting the wafer W on the cooling plate 3 once and rotating the cooling plate 3 by 90 degrees are repeated to heat the wafer W. Then, for example, the wafer W is rotated by 90 degrees, is mounted on the heating plate 40 at a total of four kinds of angles including the angle before the rotation of the wafer W, and is heated for a total of 60 seconds. Thereafter, as in the first embodiment, the wafer W is transferred to the cooling plate 3 where the wafer W is cooled down to, for example, 110 degrees C. Thereafter, the wafer W is unloaded. In addition, when changing the mounting angle of the wafer W by rotating the cooling plate 3, the wafer W may be cooled by the cooling plate 3 or may not be cooled. Here, the wafer W is assumed to be cooled down for, for example, 10 seconds, each time.

When heating the wafer W, there may be a case where a difference in heating temperature occurs in the plane of the heating plate 40 so that the mounted wafer W has a portion that is easily heated and a portion that is harder to heat. If the temperature of the wafer W becomes uneven in the plane of the wafer W, the film thickness of the wafer W may not be made uniform.

Therefore, when mounting and heating the wafer W on the heating part 4, the wafer W is heated while changing the mounting angle of the wafer W. Thus, it is possible to make the temperature of the wafer W uniform in the plane, and for example, to improve the in-plane uniformity of the film thickness of the wafer W, as described in the following embodiment.

Third Embodiment

A heating device according to a third embodiment of the present disclosure will be described. This heating device is similar in configuration with the heating device 1 described in the first embodiment except that a heating part 400 illustrated in FIG. 30 is installed instead of the heating part 4.

Figure 30:
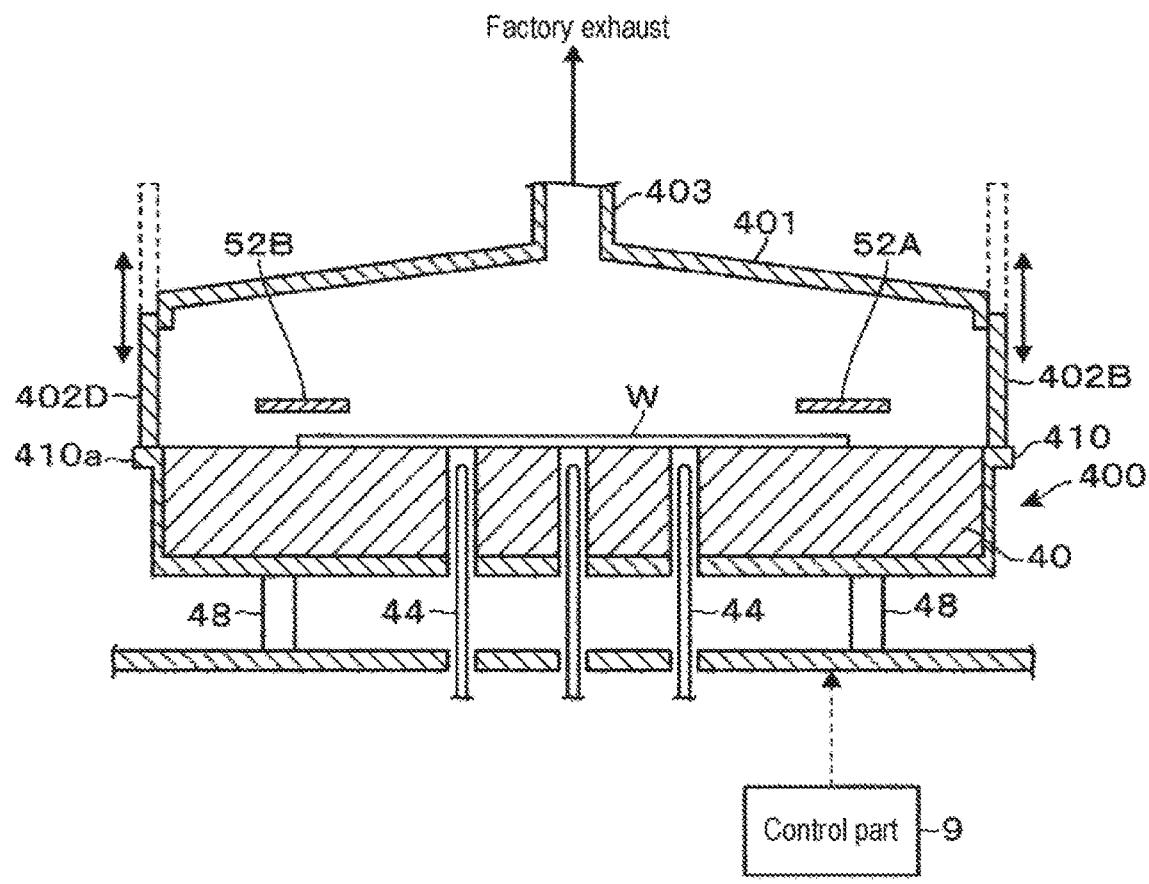
FIG. 30 is a longitudinal front view illustrating a heating device according to a third embodiment of the present disclosure.

A ceiling plate member 401 installed in the heating part 400 includes four shutters 402A to 402D configured to surround the wafer W in four orthogonally related directions (only the shutters 402B and 402D arranged at left and right sides of the wafer W are described in FIG. 30). The shutters 402A to 402D are configured to be individually opened and closed. In addition, an exhaust port 403 is formed at the center of the ceiling surface which covers above the wafer W in the ceiling plate member 401. The exhaust port 403 is connected to a factory exhaust system. Furthermore, a flange 410a of a lower member 410 has a rectangular shape when viewed from the top. If the shutters 402A to 402D are closed, lower surfaces of the shutters 402A to 402D are positioned on the flange 410a so that the four sides surrounding the wafer W is sealed. In addition, a program storage part for storing a program including a group of steps for executing an operation of the heating device 1 as described hereinbelow is installed in the control part 9.

Figure 31:
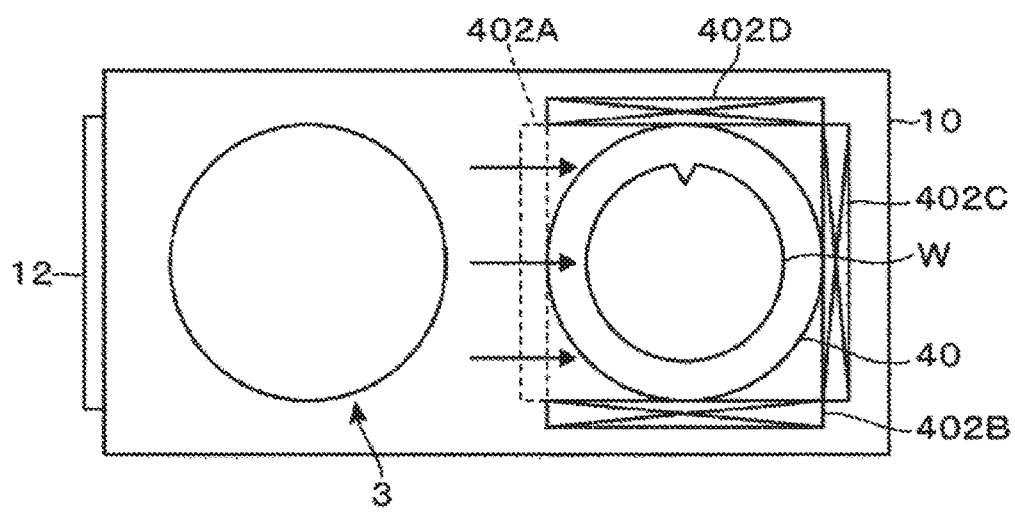
FIG. 31 is an explanatory view illustrating an operation of the heating device according to the third embodiment.
Figure 32:
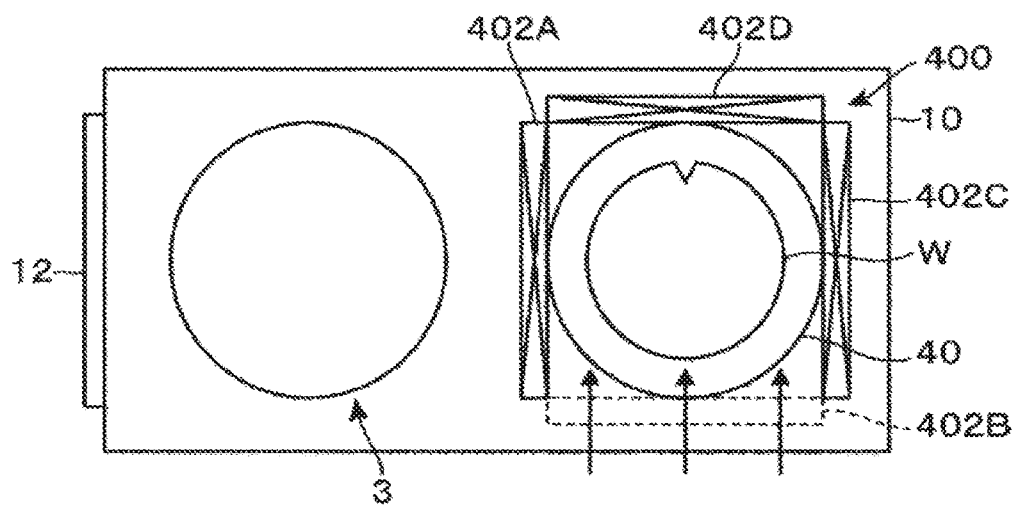
FIG. 32 is an explanatory view illustrating an operation of the heating device according to the third embodiment.

The operation of the heating device 1 according to the third embodiment will be described. In this heating device 1, when mounting and heating the wafer W on the heating plate 40, as illustrated in FIG. 31, the shutter 402A positioned at the side of the cooling plate 3 is opened to transfer the wafer W to the heating part 400. Subsequently, gas starts to be supplied into the housing 10 and to be exhausted from the exhaust port 403 while opening the shutter 402A. Furthermore, the elevating pins 44 are lowered to mount the wafer W on the heating plate 40 for heating. Thus, an air flow in which the gas introduced from the side of the shutter 402A flows on the surface of the wafer W and is exhausted from the exhaust port 403 is formed. Thereafter, as illustrated in FIG. 32, in the state where the wafer W is heated, the shutter 402A is closed and the shutter 402B is opened. As a result, air flow flowing from the shutter 402B onto the surface of the wafer W is formed on the surface of the wafer W.

In this manner, when heating the wafer W by the heating part 400, the gas is exhausted from above the wafer W, and the opening/closing operation of the shutters 402A to 402D surrounding the periphery of the wafer W is sequentially switched so that the direction in which the gas is introduced is sequentially switched. Therefore, when heating the wafer W, the flow direction of the gas is sequentially switched on the surface of the wafer W.

When the air flow in a certain direction is formed on the surface of the wafer W, a portion that is likely to promote volatilization of a solvent and a portion that has difficulty in promoting volatilization of a solvent may be formed on the surface of the wafer W. Therefore, when heating the wafer W, by sequentially switching the gas flow direction on the surface of the wafer, it is possible to improve the in-plane uniformity of the volatilization amount of the solvent on the surface of the wafer W. By using the heating part 400 configured as above, it is possible to further improve the in-plane uniformity of the heat treatment of the wafer W.

Examples

An example in which a wafer W subjected to a coating process was subjected to heat treatment by using the heating device described in the first embodiment and the heating method described in the first embodiment in order to verify the effects of the embodiments of the present disclosure, is defined as Example 1. Furthermore, the wafer W subjected to the coating process was heated by the heating part 4 for 15 seconds and transferred to the cooling plate 3 once by using the heating device illustrated in the second embodiment, as illustrated in the second embodiment. Thereafter, the cooling plate was rotated by 90 degrees to rotate the mounting angle of the wafer. Subsequently, the wafer W was then returned to the heating part 4 where the wafer W was further subjected to the heat treatment for 15 seconds. The process of rotating the wafer W and the process of heating the wafer W for 15 seconds were repeated three times. In this manner, a total of four times of heat treatments were conducted as follows: heating the wafer W for 15 seconds at the initial mounting angle, following by rotating the wafer W by 90 degrees and heating the wafer W for 15 seconds, following by rotating the wafer W by 180 degrees and heating the wafer W for 15 seconds, and following by rotating the wafer W by 270 degrees and heating the wafer W for 15 seconds. This example is defined as Example 2.

A film thickness distribution was measured for each of Examples 1 and 2 to measure a difference between the maximum value and the minimum value of the film thickness and 3σ of the film thickness distribution.

FIG. 33 is a contour map showing a film thickness distribution in each of Examples 1 and 2. In Example 1, the difference between the maximum value and the minimum value of the film thickness was 8.07 nm, and 3σ was 6.12 nm. In Example 2, the difference between the maximum value and the minimum value of the film thickness was 4.13 nm and 3σ was 3.08 nm.

In Example 1, the in-plane uniformity of the film thickness of the wafer W was good. Even in Example 2, the in-plane uniformity of the film thickness of the wafer W was good, which shows a better value as compared with that in Example 1.

According to the above results, it is possible to improve the in-plane uniformity of the film thickness of the wafer by using the heating device of the present disclosure, and to more uniformly heat the wafer W by using the heating device according to the second embodiment. Thus, it can be said that the in-plane uniformity of the film thickness of the wafer W becomes better.

According to the present disclosure in some embodiments, a substrate heated by a heating plate is transferred to a cooling plate by a substrate transfer mechanism. A moving mechanism constituting a driving system of the substrate transfer mechanism is installed below a water-cooling plate which is provided across a region below the heating plate and the cooling plate. Thus, the radiation of heat from the heating plate to the moving mechanism is blocked by a heat shielding plate. As a result, although a temperature of the heating plate is increased, heat resistance of the moving mechanism is high. Therefore, the present disclosure is a technique adapted for an increase in temperature of a substrate heating device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate heating device, comprising:
    a heating plate configured to heat a first substrate mounted on the heating plate;
    a cooling plate installed adjacent to the heating plate in a front-back direction, and configured to mount a second substrate, before being heated, introduced to the cooling plate from outside, and cool the first substrate heated by the heating plate;
    a substrate transfer mechanism configured to transfer the first substrate or the second substrate between the cooling plate and the heating plate;
    a heat shielding plate installed across a region including a region right below the heating plate and a region right below the cooling plate and having a flow path, which is a cooling mechanism for cooling the heat shielding plate, formed inside and along the heat shielding plate to allow a cooling water as a cooling medium to flow through the flow path to cool the heat shielding plate, the cooling plate and the heating plate being fixed to an upper surface of the heat shielding plate; and
    gas supply configured to set an atmosphere in which the first substrate is heated to a low oxygen atmosphere,
    wherein the substrate transfer mechanism includes a substrate holding part having a plate-shape and configured to hold the first substrate or the second substrate and a moving mechanism installed below the heat shielding plate to move the substrate holding part in the front-back direction along a guide rail.

2. The device of claim 1, wherein the heating plate is configured to heat the first substrate to a temperature of 450 degrees C. or higher.

3. The device of claim 1, wherein the substrate holding part includes:
    a left holding part extending upward at a left side of the cooling plate and being bent inward of the cooling plate to hold a left periphery of the first substrate or the second substrate; and
    a right holding part extending upward at a right side of the cooling plate and being bent inward of the cooling plate to hold a right periphery of the first substrate or the second substrate.

4. The device of claim 1, wherein the heat shielding plate has a left notch portion and a right notch portion formed therein,
    wherein the left holding part and the right holding part are moved while penetrating through the left notch portion and the right notch portion, respectively.

5. The device of claim 1, further comprising:
    a plurality of elevating members penetrating through the heating plate and configured to move upward and downward on a surface of the heating plate; and
    an elevating mechanism installed below the heat shielding plate and configured to raise and lower the plurality of elevating members.

6. The device of claim 1, further comprising: a rotary mechanism configured to rotate the cooling plate around a vertical axis,
    wherein the first substrate heated by the heating plate is mounted on the cooling plate, the cooling plate is rotated by the rotary mechanism to change a first mounting angle of the first substrate to a second mounting angle, and subsequently, the first substrate is mounted on the heating plate with the second mounting angle and is heated by the heating plate.

7. The device of claim 1, wherein the flow path is provided in only a partial area of the heat shielding plate overlapping the heating plate when seen in a top view.

8. The device of claim 1, further comprising:
    a support member connecting the substrate holding part and the moving mechanism to fix the substrate holding part with respect to the moving mechanism,
    wherein the substrate holding part extends in the front-back direction,
    wherein the support member extends downwards from an end of the substrate holding part to be connected to the moving mechanism, the end of the substrate holding part being far from the heating plate, and
    wherein the heat shielding plate has a notch formed in a lateral side of the heat shielding plate into which the support member is inserted.

9. The device of claim 8, wherein the notch is provided outside an area in which the flow path is provided.

10. The device of claim 1, further comprising a housing, wherein the heat shielding plate is installed to divide an interior of the housing into two portions in an up-down direction of the housing.

11. The device of claim 1, wherein the heat shielding plate is disposed separate from the heating plate.

12. A substrate heating device, comprising:
- a heating plate provided in a housing and configured to heat a first substrate mounted on the heating plate;
- a cooling plate installed adjacent to the heating plate in a front-back direction in the housing, and configured to mount a second substrate, before being heated, introduced to the cooling plate from outside, and cool the first substrate heated by the heating plate;
- a substrate transfer mechanism configured to transfer the first substrate or the second substrate between the cooling plate and the heating plate;
- a heat shielding plate installed across a region below the heating plate and the cooling plate;
- a cooling mechanism configured to cool the heat shielding plate;
- an exhaust part provided in a back side of the heating plate when viewed from the cooling plate to exhaust an internal atmosphere of the housing;
- a first gas supply part disposed between the cooling plate and the heating plate to supply a gas for forming a low-oxygen atmosphere toward the heating plate side so that an atmosphere in which the first substrate is heated becomes the low-oxygen atmosphere; and
- a second gas supply part configured to supply a low-oxygen gas to the cooling plate,
wherein the substrate transfer mechanism includes a substrate holding part configured to hold the first substrate or the second substrate and a moving mechanism installed below the heat shielding plate to move the substrate holding part in the front-back direction.

\* \* \* \* \*